United States Patent
Yu et al.

(10) Patent No.: US 9,969,614 B2
(45) Date of Patent: May 15, 2018

(54) MEMS PACKAGES AND METHODS OF MANUFACTURE THEREOF

(71) Applicant: Taiwan Semiconductor Manufacturing Company, Ltd., Hsin-Chu (TW)

(72) Inventors: Chen-Hua Yu, Hsin-Chu (TW); Kuo-Chung Yee, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 14/725,731

(22) Filed: May 29, 2015

(65) Prior Publication Data

US 2016/0347609 A1    Dec. 1, 2016

(51) Int. Cl.
  *B81C 1/00*    (2006.01)
  *B81B 7/00*    (2006.01)
  *B81B 7/02*    (2006.01)

(52) U.S. Cl.
  CPC ........ *B81C 1/00238* (2013.01); *B81B 7/0006* (2013.01); *B81C 1/00269* (2013.01); *B81C 2203/0118* (2013.01); *B81C 2203/0792* (2013.01); *H01L 2224/48091* (2013.01); *H01L 2924/16235* (2013.01)

(58) Field of Classification Search
  CPC . B81B 7/0006; B81B 7/0074; B81C 1/00238; B81C 1/00293; B81C 1/00261; B81C 1/0023; B81C 1/00269; B81C 1/00873; B81C 1/00301; B81C 1/00896; B81C 1/0301; B81C 2203/0118; B81C 2203/0792; H01L 2224/48091; H01L 2224/97; H01L 2924/1461; H01L 2924/16235
  USPC ............................................. 438/50–53, 406
  See application file for complete search history.

(56) References Cited

U.S. PATENT DOCUMENTS

| | | | |
|---|---|---|---|
| 7,118,991 B2 * | 10/2006 | Chase | ................. B81C 1/00333 438/456 |
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,829,961 B2 | 11/2010 | Hsiao | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |

(Continued)

FOREIGN PATENT DOCUMENTS

| | | |
|---|---|---|
| TW | 200830480 A | 7/2008 |
| TW | 201526205 A | 7/2015 |
| WO | 2015106854 A1 | 7/2015 |

*Primary Examiner* — Johannes P Mondt
(74) *Attorney, Agent, or Firm* — Slater Matsil, LLP

(57) ABSTRACT

Microelectromechanical systems (MEMS) packages and methods of manufacture thereof are described. In an embodiment, a method of manufacturing a MEMS package may include attaching a MEMS structure having a capping structure thereon to a device wafer comprising a plurality of first devices formed therein to form a wafer level MEMS package; and singulating the device wafer having the MEMS structure attached thereto to form a plurality of chip scale MEMS packages.

20 Claims, 29 Drawing Sheets

(56) References Cited

U.S. PATENT DOCUMENTS

| | | |
|---|---|---|
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 8,871,551 B2 | 10/2014 | Partridge et al. |
| 2005/0023656 A1* | 2/2005 | Leedy ................ B81B 7/02 257/678 |
| 2009/0085191 A1* | 4/2009 | Najafi ............. B81B 7/0058 257/698 |
| 2009/0212407 A1* | 8/2009 | Foster ............. B81B 7/0006 257/686 |
| 2011/0309486 A1* | 12/2011 | Dalal ............. B81C 1/00333 257/678 |
| 2011/0317371 A1* | 12/2011 | Liu ................. H01L 21/6835 361/729 |
| 2012/0266684 A1* | 10/2012 | Hooper ............. G01L 9/0052 73/721 |
| 2013/0263641 A1* | 10/2013 | Opris ................ G01P 21/00 73/1.38 |
| 2013/0285165 A1* | 10/2013 | Classen ........... B81C 1/00238 257/415 |
| 2014/0001645 A1 | 1/2014 | Lin et al. |
| 2014/0015123 A1* | 1/2014 | Bowles ............ B81C 1/0023 257/737 |
| 2014/0225258 A1 | 8/2014 | Chiu et al. |
| 2014/0239979 A1* | 8/2014 | Wygant ............ B81B 7/007 324/658 |
| 2014/0252572 A1 | 9/2014 | Hou et al. |
| 2014/0353775 A1 | 12/2014 | Formosa et al. |
| 2014/0356989 A1* | 12/2014 | Chen ............ B81C 99/0045 438/17 |
| 2014/0374918 A1* | 12/2014 | Weber ............ H01L 23/481 257/774 |
| 2015/0061045 A1* | 3/2015 | Fuergut ............ B81B 7/007 257/415 |
| 2015/0108653 A1* | 4/2015 | Hooper ............ B81B 7/007 257/774 |
| 2015/0128703 A1 | 5/2015 | Kaelberer et al. |
| 2015/0158718 A1* | 6/2015 | Reinmuth ........... B81C 1/0023 257/415 |
| 2015/0329351 A1 | 11/2015 | Cheng et al. |
| 2015/0360936 A1* | 12/2015 | Tayebi ............ B81C 1/0023 257/369 |
| 2016/0318757 A1* | 11/2016 | Chou ............ B81C 1/00595 |

* cited by examiner

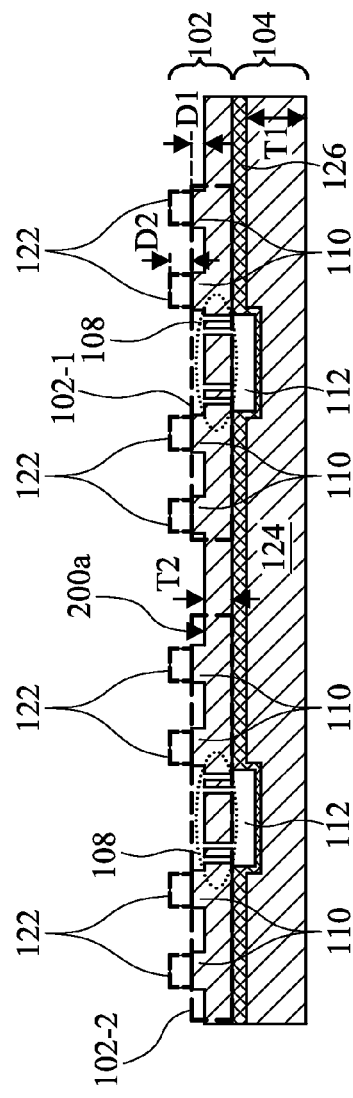
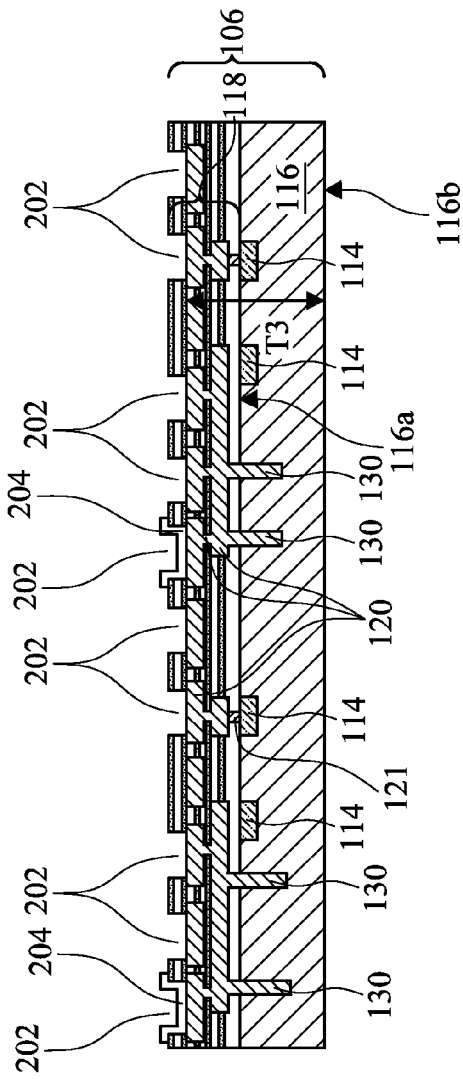
Fig. 2A
Fig. 2B

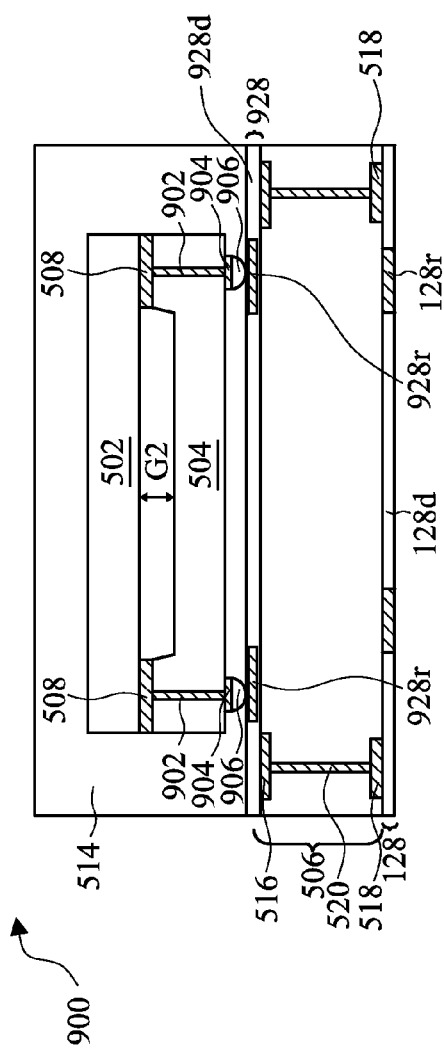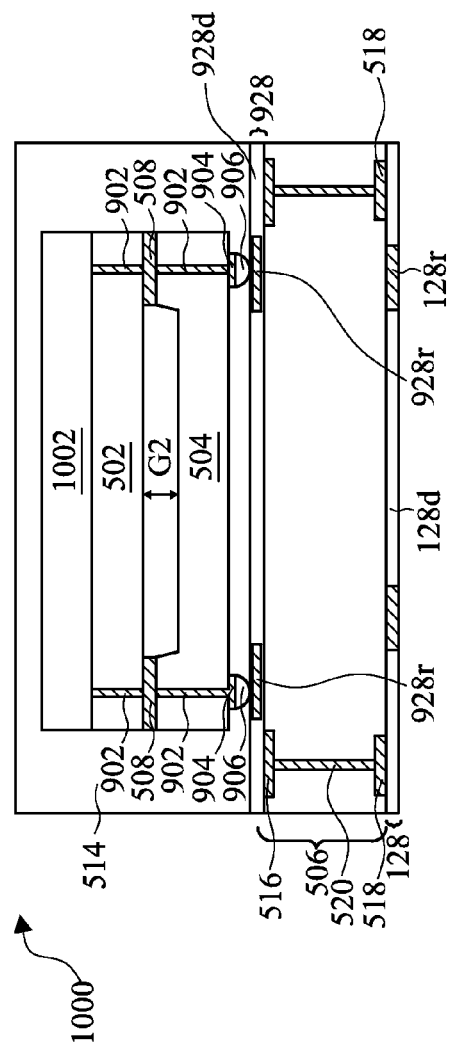

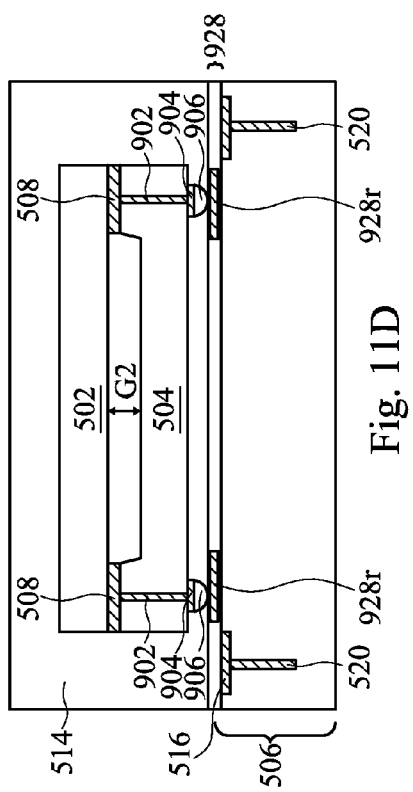
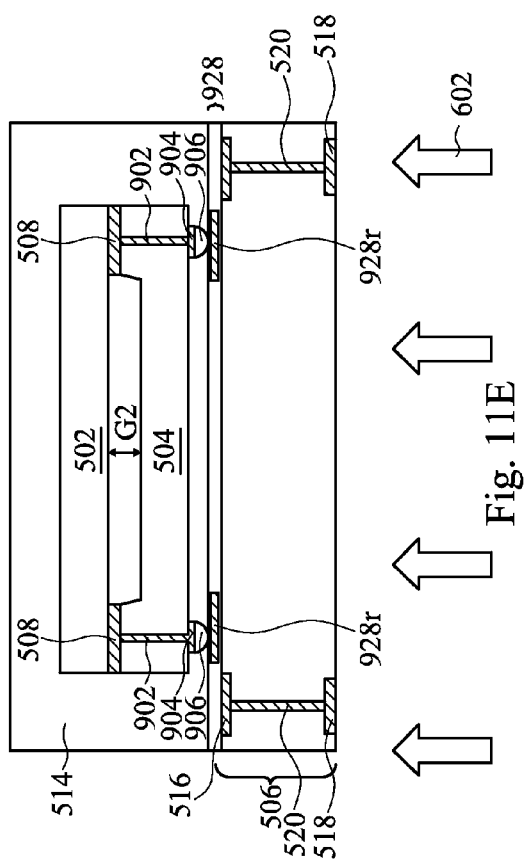

MEMS PACKAGES AND METHODS OF MANUFACTURE THEREOF

BACKGROUND

The term micro electromechanical system (MEMS) or micro mechanical system/structure is often used to refer to small integrated devices or systems that combine electrical and mechanical components. When focusing on the micro mechanical parts, the term "micro mechanical system" may be used to describe small integrated devices or systems which comprises one or more micro mechanical elements and possibly, but not necessarily, electrical components and/or electronic components.

Micro mechanical systems may be used as, for example, actuators, transducers or sensors, e.g. pressure sensors. Pressure sensors are nowadays mass products in automobile electronics and consumer goods electronics. For many of these applications, systems are used in which the MEMS sensor is controlled and/or operated with the aid of an application-specific integrated circuit (ASIC). In such examples, the MEMS sensor and the ASIC may be included in a MEMS package.

The mechanically active elements of a MEMS package may typically require relatively complex structures, such as recesses, beams, cantilevers, undercuts, cavities etc. Possibly, a relatively high number of manufacturing steps are required. Furthermore, the process used for manufacturing the MEMS package may need to be compatible with possible subsequent manufacturing steps that are used for creating electrical and/or electronic components, for example. Consequently, improvements in methods of manufacturing a MEMS package may be required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2F show a process flow illustrating a method of manufacturing a single-sided wafer level MEMS package, in accordance with an embodiment.

FIG. 9 shows a single-sided chip-on-wafer MEMS package having one or more through-vias in a MEMS cap, in accordance with an embodiment.

FIG. 10 shows a single-sided chip-on-wafer MEMS package having an analog chip, in accordance with an embodiment.

FIGS. 11A to 11F show a process flow illustrating a method of manufacturing a single-sided chip-on-wafer MEMS package having one or more third through-vias, in accordance with an embodiment.

DETAILED DESCRIPTION

Figure 1A:
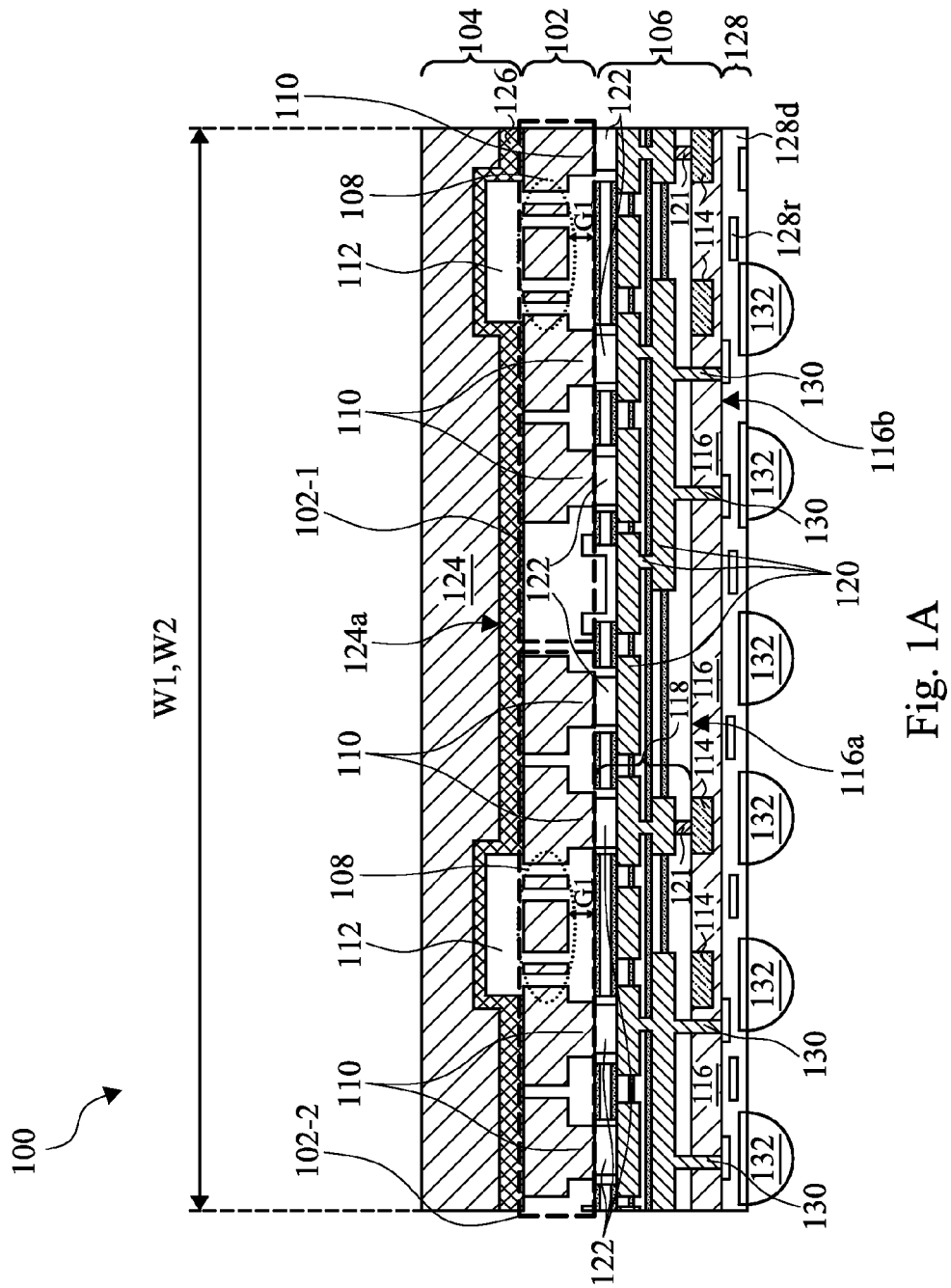
FIGS. 1A and 1B show a single-sided wafer level microelectromechanical systems (MEMS) package, in accordance with an embodiment.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows a wafer level microelectromechanical systems (MEMS) package 100, in accordance with one or more embodiments. The wafer level MEMS package 100 may comprise a MEMS wafer 102 disposed between a capping wafer 104 and a device wafer 106. In the example shown in FIG. 1A, the MEMS wafer 102 and the device wafer 106 may have substantially equal widths W1, W2. In some embodiments, a width of the MEMS wafer 102 and a width of the device wafer are in a range from about 8 inches to about 18 inches. In some embodiments, a width of the MEMS wafer is in a range from about 6 inches to about 12 inches, and a width of the device wafer is in a range from about 8 inches to about 18 inches.

The MEMS wafer 102 may comprise a plurality of MEMS devices 102-1, 102-2, which may be arranged laterally adjacent to each other. In the example shown in FIG. 1A, the plurality of MEMS devices 102-1, 102-2 includes a first MEMS device 102-1 and a second MEMS device 102-2. However, in other embodiments, the number of MEMS devices formed in the MEMS wafer 102 may be more than two (e.g. three, four, five, tens of, etc.). In some embodiments, the plurality of MEMS devices 102-1, 102-2 of the MEMS wafer 102 may be arranged as a matrix in the MEMS wafer 102. The first MEMS device 102-1 and the second MEMS device 102-2 may, as an example, be a first MEMS chip and a second MEMS chip, respectively. Consequently, the MEMS wafer 102 may be a wafer including a plurality of MEMS chips that have not been singulated or separated from each other.

The MEMS wafer 102 may comprise a semiconductor material, a polymer, a metal, a ceramic, combinations thereof, or the like. In an embodiment where the MEMS wafer 102 comprises semiconductor material, the semiconductor material may include an elementary semiconductor (e.g. including silicon and/or germanium in crystal), a compound semiconductor (e.g. including at least one of oxide, silicon nitride, silicon carbide, gallium arsenic, gallium phosphide, indium phosphide, indium arsenide, or indium antimonide), an alloy semiconductor (e.g. including at least one of Cu, Al, AlCu, W, Ti, SiGe, GaAsP, AlInAs, AlGaAs, GaInAs, GaInP, or GaInAsP), or combinations thereof. In an embodiment where the MEMS wafer 102 comprises a polymer, the polymer may include an epoxy, a polyimide, benzocyclobutene (BCB), polybenzoxazole (PBO), combinations thereof, or the like. In an embodiment where the MEMS wafer 102 comprises a ceramic, the ceramic may comprise nitrides of silicon, aluminum and/or titanium, silicon carbide, combinations thereof, or the like.

The MEMS wafer 102 may include one or more movable elements 108 formed therein. In the example shown in FIG. 1A, only two movable elements 108 are shown; however, in other embodiments, the number of movable elements 108 may be less than two (e.g. one) or may be more than two (e.g. three, four, five, six, or more). In some embodiments, the each of the plurality of MEMS devices 102-1, 102-2 of the MEMS wafer 102 may comprise at least one movable element 108. For example, in the illustration of FIG. 1A, the first MEMS device 102-1 and the second MEMS device 102-2 each comprise a movable element 108. The movable element 108 may, as an example, be a flexible membrane (e.g. in a deformable mirror device formed in the MEMS wafer 102), a cantilevered beam (e.g. in a motion sensor formed in the MEMS wafer 102), a series of fingers in a comb structure (e.g. in an accelerometer formed in the MEMS wafer 102), or the like.

The movable element 108 may be formed by patterning portions of the MEMS wafer 102 (e.g. using lithographic and/or etching processes). In order to allow for free movement of the movable element 108 in a three dimensional space, the MEMS wafer 102 may include standoff regions 110 (e.g. pillars) that create a first gap G1 (e.g. a first air gap) between the movable element 108 and the device wafer 106 (e.g. a surface of the device wafer 106 closest in proximity to the movable element 108). Alternatively or additionally, the capping wafer 104 may have a cavity 112 formed therein in order to allow for free movement of the movable element 108. The cavity 112 of the capping wafer 104 may be aligned with the movable element 108 of the MEMS wafer 102, as shown in FIG. 1A.

Referring now to the device wafer 106 of the wafer level MEMS package 100, the device wafer 106 may have one or more first devices 114 formed therein. In an embodiment, the device wafer 106 may be an application-specific integrated circuit (ASIC) wafer, and the one or more first devices 114 may be one or more ASIC devices. In an embodiment, the one or more ASIC devices may be configured to perform a single function. In another embodiment, the one or more ASIC devices may be configured to perform a combination of functions. In such an embodiment, the device wafer 106 may be a combo ASIC device wafer.

The device wafer 106 may comprise a substrate 116 having the one or more first devices 114 formed therein (e.g. as shown in the example of FIG. 1A) or thereon. The substrate 116 may comprise a semiconductor material, which may comprise one or more of the semiconductor materials described above in respect of the MEMS wafer 102. The device wafer 106 may comprise a plurality of dielectric layers 118 (e.g. stacked dielectric layers) disposed at a first major surface 116a of the substrate 116. As an example, the dielectric layer 118 in closest proximity to the substrate 116 may be an inter-layer dielectric (ILD) layer of the device wafer 106. The plurality of dielectric layers 118 may have a plurality of interconnect structures 120 formed therein. The plurality of interconnect structures 120 may comprise a plurality of metal layers and one or more vias interconnecting the plurality of metal layers. As an example, the metal layer farthest in distance from the substrate 116 may be a topmost metal layer of the device wafer 106, while the metal layer closest in distance to the substrate 116 may be a bottommost metal layer of the device wafer 106. The plurality of interconnect structures 120 may comprise a conductive material such as a metal or a metal alloy. As an example, the plurality of interconnect structures 120 may comprise copper, gold, aluminum, an alloy thereof, or the like.

The device wafer 106 may further include one or more device plugs 121 disposed in a layer of the plurality of dielectric layers 118. As an example, the one or more device plugs 121 may be disposed in the ILD layer of the device wafer 106 (e.g. the dielectric layer in closest proximity to the substrate 116). The one or more device plugs 121 may serve to electrically connect the one or more first devices 114 to the plurality of interconnect structures 120 disposed in the plurality of dielectric layers 118. The one or more device plugs 121 may comprise similar materials as the plurality of interconnect structures 120.

The MEMS wafer 102 may be bonded to the device wafer 106 by a plurality of inter-wafer connectors 122 disposed between the MEMS wafer 102 and the device wafer 106. As an example, the plurality of inter-wafer connectors 122 may be bonded to the standoff regions 110 of the MEMS wafer 102 and also to the topmost metal layer of the device wafer 106, thereby attaching the MEMS wafer 102 and the device wafer 106 to each other, as shown in FIG. 1A. The plurality of inter-wafer connectors 122 may comprise a eutectic material. For example, the plurality of inter-wafer connectors 122 may comprise a lead-based solder material (e.g. Pb—Sn compositions); a lead-free solder material (e.g. including InSb); a tin, silver, and copper (SAC) composition; a titanium, tin, and copper composition; copper, nickel and tin compositions; combinations thereof; or the like. In some embodiments, the plurality of inter-wafer connectors 122 may comprise a plurality of layers by process of electro chemical plating (ECP); metal deposition; combinations thereof. As an example, in an embodiment where the plurality of inter-wafer connectors 122 comprises a titanium, tin, and copper composition, a respective inter-wafer connector 122 may comprise as a first layer comprising titanium, a second layer comprising tin, and a third layer comprising copper (e.g. as shown in the example of FIG. 2A).

Referring now to the capping wafer 104 of the wafer level MEMS package 100, the capping wafer 104 may include a semiconductor substrate 124 and an oxide layer 126 disposed on a major surface 124a of the semiconductor substrate 124 that faces the MEMS wafer 102. The oxide layer 126 may be formed conformally over the major surface 124a, and thus, may line the cavity 112 formed in the capping wafer 104. The semiconductor substrate 124 may comprise one or more of the semiconductor materials described above in respect of the MEMS wafer 102. The oxide layer 126 may comprise an oxide of a semiconductor material (e.g. silicon oxide). The capping wafer 104 may be bonded to the MEMS wafer 102 by fusion bonding that may be established between the material of the oxide layer 126 on both the capping device 106 and the MEMS chip 102.

Figure 3:
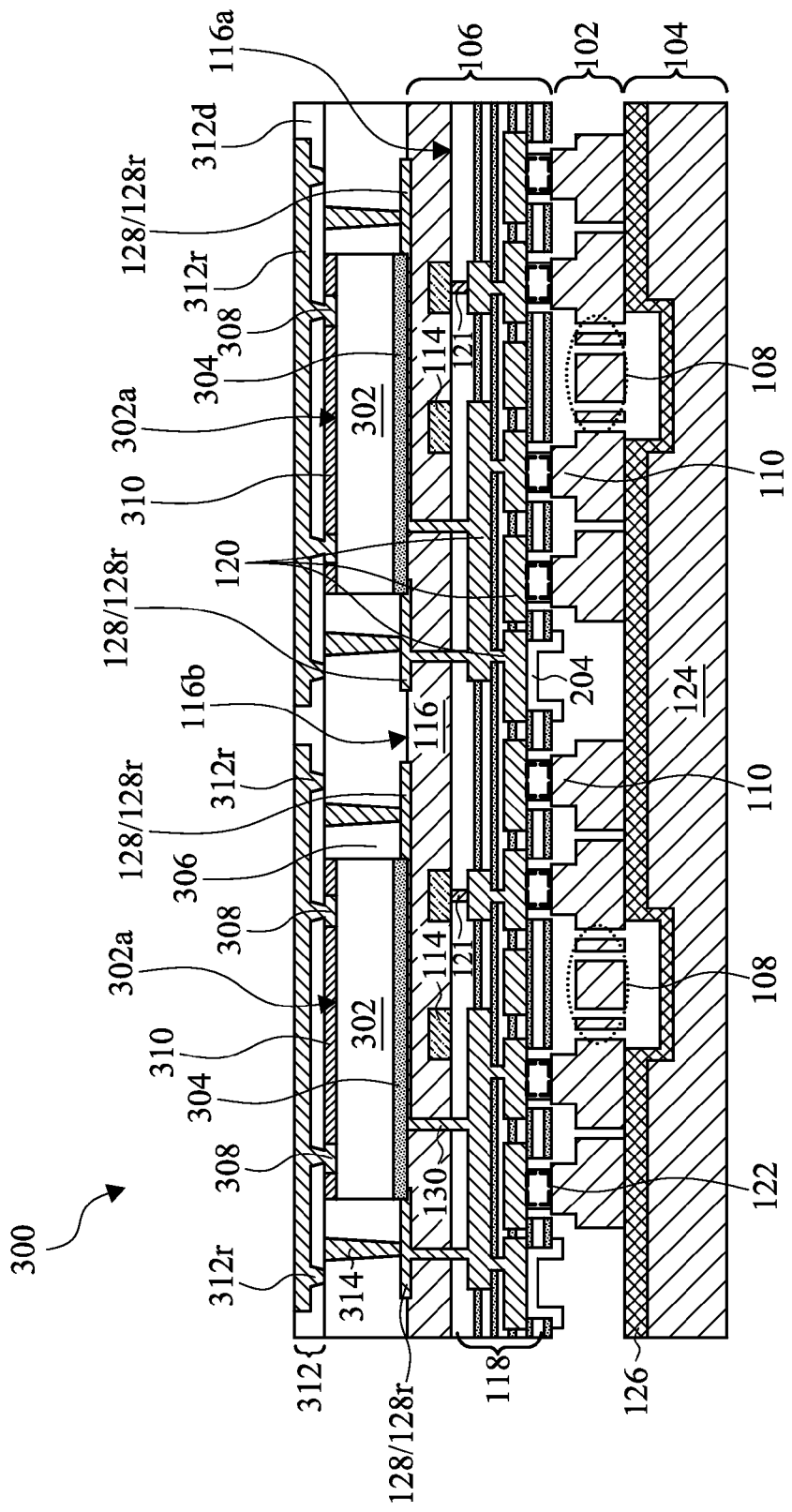
FIG. 3 shows a double-sided wafer level MEMS package, in accordance with an embodiment.

The wafer level MEMS package 100 may further include a first redistribution layer (RDL) 128 disposed at a second major surface 116b of the substrate 116 opposite the first major surface 116a. The first RDL 128 may include conductive structures 128r (e.g. contact pads, conductive traces, UBMs, or the like) that may be partially or fully disposed within an insulating layer 128d (e.g. a dielectric layer). In some embodiments, the insulating layer 128d may comprise a plurality of sub-layers (e.g. a plurality of dielectric sub-layers). The conductive structures 128r may comprise similar materials as the plurality of interconnect structures 120. In the example of FIG. 1A, the first RDL 128 is shown as being a multi-level structure having conductive structures 128r formed over a plurality of layers or levels. However, in other embodiments, the first RDL 128 may be a single-level structure having a single level conductive structure 128r (e.g. a conductive trace, as shown in FIG. 3).

The first RDL 128 may be electrically connected to the plurality of interconnect structures 120 by one or more via structures 130, which extend through the substrate 116 and one or more of the plurality of dielectric layers 118 (e.g. the ILD layer) of the device wafer 106. As an example, the one or more via structures 130 may extend between the second major surface 116b and the first major surface 116a of the substrate 116, and may further extend into one or more of the plurality of dielectric layers 118 from the first major surface 116b of the substrate 116, as shown in the example of FIG. 1A. A first end of the one or more via structures 130 may be electrically and/or physically coupled to the plurality of interconnect structures 120 disposed in the plurality of dielectric layers 118 (e.g. the bottom most metal layer), while a second end may be electrically and/or physically coupled to the conductive structures 128r of the first RDL 128, thereby electrically connecting the first RDL 128 and the plurality of interconnect structures 120 to each other. The one or more via structures 130 may comprise similar materials as the plurality of interconnect structures 120.

The wafer level MEMS package 100 may further include a plurality of connectors 132 formed at a surface of the first RDL 128 facing away from the device wafer 106. In the example shown in FIG. 1A, the plurality of connectors 132 may be a ball-grid array (BGA). In other embodiments, the plurality of connectors 132 may include bumps, pillars, combinations thereof, or the like. The plurality of connectors 132 may include an electrically conductive material (e.g. a metal or metal alloy). For example, the plurality of connectors 132 may include a solder material. By way of another example, the plurality of connectors 132 may include at least one of tin, nickel, lead, copper, gold, silver, zinc, bismuth, magnesium, antimony, indium or an alloy thereof. In an embodiment, at least one connector of the plurality of connectors 132 may be electrically and/or physically connected to one or more of the conductive structures 128r of the first RDL 128.

Figure 1B:
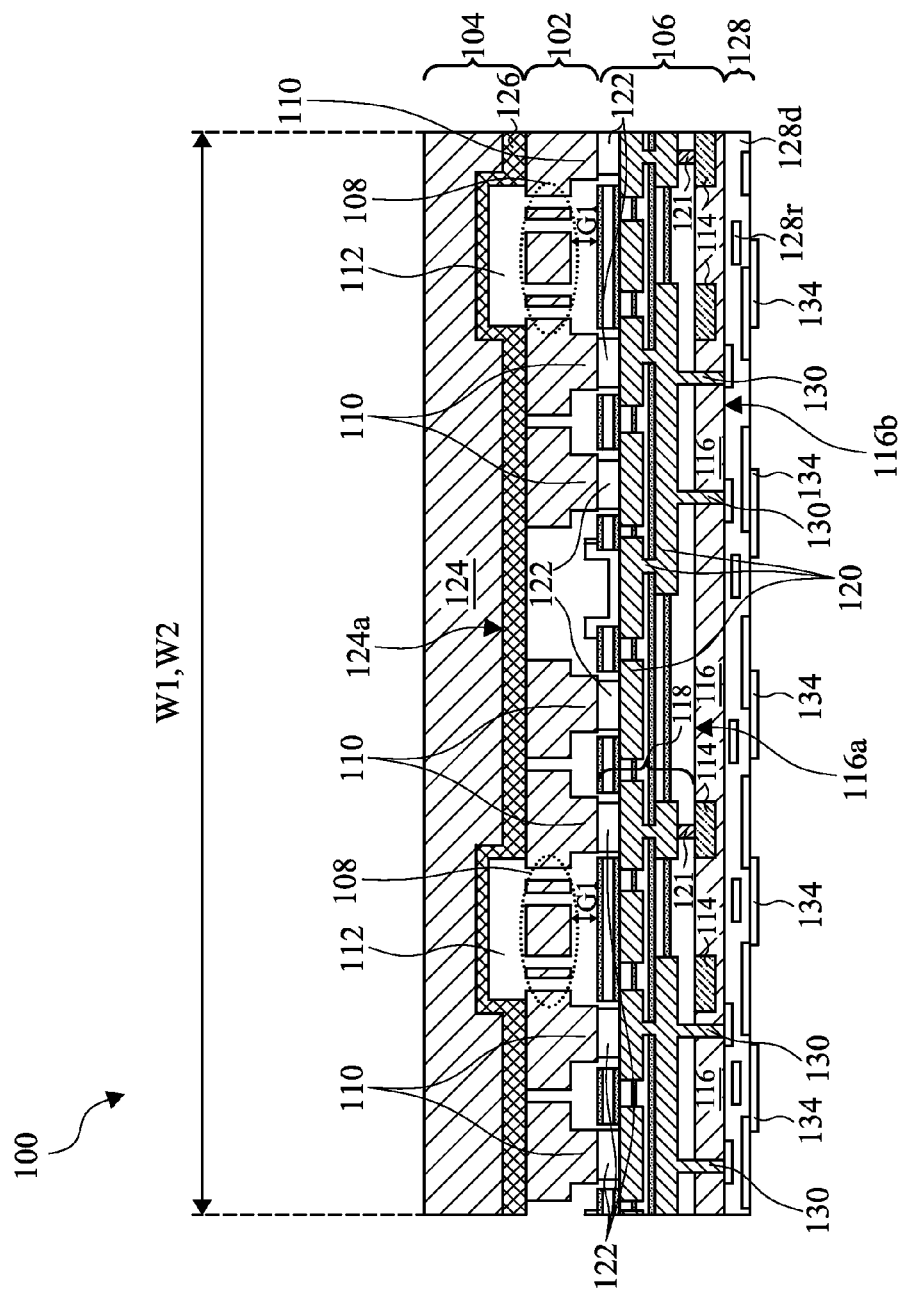

In the embodiment shown in FIG. 1A, the plurality of connectors 132 formed at the surface of the first RDL 128 facing away from the device wafer 106 may be a BGA. However, in another embodiment (e.g. as shown in the example of FIG. 1B), the plurality of connectors 132 may be replaced with a plurality of pads 134, which may, as an example, be a land grid array (LGA). The plurality of pads 134 may comprise similar materials as the plurality of interconnect structures 120.

Figure 2C:
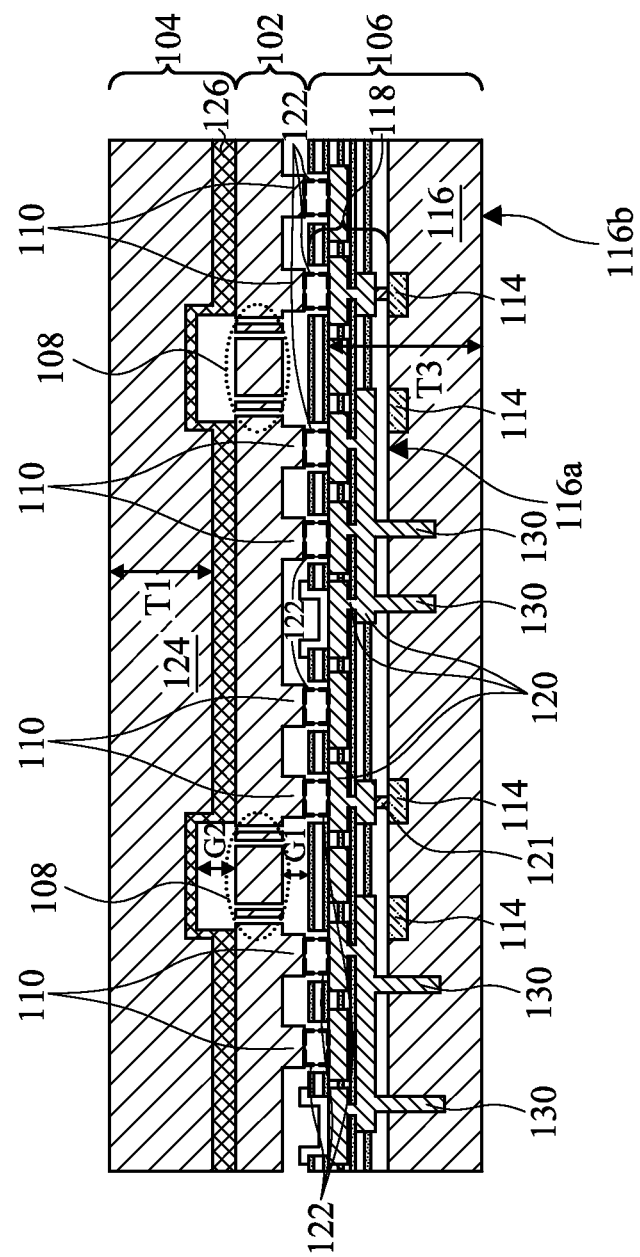

FIGS. 2A to 2F show a process flow illustrating a method of manufacturing a wafer level MEMS package, in accordance with one or more embodiments. The process flow shown in FIG. 2A to FIG. 2F may, for example, be used to manufacture the wafer level MEMS packages 100 shown in FIGS. 1A and 1B. As shown in FIG. 2A, the MEMS wafer 102 comprising the plurality of MEMS devices 102-1, 102-2 may be attached or bonded to the capping wafer 104, e.g. by fusion bonding that may exist between material of the oxide layer 126 of the capping wafer 104 and the material of the MEMS wafer 102.

The capping wafer 104 may be formed separately from the MEMS wafer 102. For example, the semiconductor substrate 124 of the capping wafer 104 may be patterned (e.g. by an etching process) to form the cavities 112. Thereafter, the oxide layer 126 may be formed to line the semiconductor substrate 124 and the cavities 112 formed therein. In an embodiment, the oxide layer 126 may be formed by an oxidation process that may be applied to the semiconductor substrate 124. In another embodiment, the oxide layer 126 may be formed by a deposition process (e.g. conformal deposition process). The semiconductor substrate 124 of the capping wafer 104 may have a first thickness T1, which may be a thickness of the semiconductor substrate 124 in a region of the semiconductor substrate 124 outside the cavity 112. The first thickness T1 may be in a range from about 300 micrometers to about 600 micrometers to control the desired warpage of MEMS wafer 102, although other thicknesses may be possible as well in other embodiments.

Referring to the MEMS wafer 102 shown in FIG. 2A, in some embodiments, the standoff regions 110 and the movable element 108 may be formed in the MEMS wafer 102 prior to its attachment or bonding to the capping wafer 104 thereafter. However, in other embodiments, a substrate (e.g. comprising a semiconductor material, a polymer, a metal, a ceramic, combinations thereof, or the like) may initially be attached or bonded to the capping wafer 104 (e.g. the oxide layer 126 of the capping wafer 104). Subsequently, the substrate may be processed (e.g. patterned and/or etched) to form the standoff regions 110 and the movable elements 108 of the MEMS wafer 102. In such an embodiment, the capping wafer 104 having the cavities 112 formed therein may additionally serve as a carrier to provide mechanical and/or structural support for the MEMS substrate during formation of the movable element 108 and the standoff regions 110.

As shown in FIG. 2A, the movable element 108 of the MEMS wafer 102 may be aligned with the cavity 112 of the capping wafer 104, e.g. in order to allow for free movement of the movable element 108 during operation of the MEMS wafer 102. Consequently, in the embodiment where the standoff regions 110 and the movable element 108 are formed in the MEMS wafer 102 prior to attachment or bonding to the capping wafer 104, the movable elements 108 of the MEMS wafer 102 may be aligned with the cavities 112 of the capping wafer 104 prior to and/or while bonding or attaching the capping wafer 104 and the MEMS wafer 102 to each other. However, in the embodiment where the standoff regions 110 and the movable elements 108 are formed after bonding a MEMS substrate to the capping wafer 104, the movable elements 108 may be formed in regions of the substrate that overlie the cavities 112 of the capping wafer 104. The standoff regions 110 of the MEMS wafer 102 may be disposed at a major surface 200a of the MEMS wafer 102 facing away from the capping wafer 104. The standoff regions 110 may extend from the major surface 200a by a first distance D1, which may be in a range from about 1 micrometer to about 10 micrometers. In some embodiments, a second thickness T2 of the MEMS wafer 102 (e.g. in a region of the MEMS wafer 102 that is laterally separated from the standoff regions 110) may be in a range from about 10 micrometers to about 50 micrometers, although other thicknesses may be possible as well in other embodiments.

As shown in FIG. 2A, the plurality of inter-wafer connectors 122 may be formed over a surface of the standoff regions 110. As an example, the plurality of inter-wafer connectors 122 may be formed on a surface of the standoff regions 110 facing away from the capping wafer 104. In the example of FIG. 2A, the plurality of inter-wafer connectors 122 is shown as comprising a plurality of layers. For example, the plurality of inter-wafer connectors 122 may comprise a first layer (e.g. bottommost layer) comprising titanium, a second layer comprising copper, a third layer comprising nickel, and a fourth layer comprising tin. In the other embodiments, the inter-wafer connectors 122 may comprise a first layer (e.g. bottommost layer) comprising titanium, a second layer comprising copper, a third layer comprising tin. The plurality of inter-wafer connectors 122 may be formed on the standoff regions 110 by deposition, evaporation, electroplating, printing, solder transfer, a combination thereof, or the like. The plurality of inter-wafer connectors 122 may extend from the standoff regions 110 by a second distance D2, which may be in a range from about 0.1 micrometer to about 2 micrometers, although other distances may be possible as well. In some embodiments, the plurality of inter-wafer connectors 122 may have a width (e.g. measured in a direction substantially perpendicular to the second distance D2) that may be in a range from about 5 micrometers to about 100 micrometers, although other widths may be possible as well.

FIG. 2B shows the device wafer 106, which may be processed separately from the arrangement shown in FIG. 2A. As shown in FIG. 2B, openings 202 may be formed in a dielectric layer of the plurality of dielectric layers 118 of the device wafer, e.g. by an etching process, although other processes for forming the openings 202 may be possible as well. The openings 202 may expose the metal layer farthest in distance from the substrate 116 (e.g. the topmost metal layer). Consequently, the dielectric layer in which the openings 202 are formed may be the dielectric layer farthest in distance from the substrate 116 (e.g. the topmost dielectric layer). In some embodiments, one or more of the openings 202 may be lined with a conductive liner 204, which may be electrically connected to the plurality of interconnect structures 120 disposed in the plurality of dielectric layers 118 through the metal layer farthest in distance from the substrate 116 (e.g. the topmost metal layer). The conductive liner 204 may comprise similar materials as the plurality of interconnect structures 120 and may be formed by a deposition process, a plating process, or the like, although other suitable process may be possible as well.

As shown in FIG. 2B, at this stage of the process flow, the one or more via structures 130 may extend partially into the substrate 116, e.g. from the first major surface 116a of the substrate 116 into an interior region of the substrate 116. A third thickness T3 of the device wafer 106 may be measured as a distance between the second major surface 116b of the substrate 116 and the metal layer farthest in distance from the substrate 116 (e.g. the topmost metal layer), as shown in FIG. 2B. In an embodiment, the third thickness T3 may be initially about 760 micrometers, although other thicknesses may be possible as well in other embodiments.

Referring to FIG. 2C, the device wafer 106 is attached to the MEMS wafer 102 having the capping wafer 104 bonded thereto. In particular, the MEMS wafer 102 may be bonded to the device wafer 106 using the plurality of inter-wafer connectors 122. In bonding the MEMS wafer 102 and the device wafer 106 to each other, the plurality of inter-wafer connectors 122 may be aligned with some of the openings 202 and brought into contact (e.g. physical and/or electrical contact) with the metal layer exposed by the openings 202. In an embodiment, a thermal compression bonding (TCB) process may also be performed on the plurality of inter-wafer connectors 122 to bond the MEMS wafer 102 and the device wafer 106 to each other. The use of the plurality of inter-wafer connectors 122 to bond the MEMS wafer 102 and the device wafer 106 to each other may seal (e.g. hermetically seal) the movable element 108 of the MEMS wafer 102. As described above in respect of FIG. 1A, the first gap G1 (e.g. a first air gap) may exist between the movable element 108 and the device wafer 106 due to the standoff regions 110. In an embodiment the first gap G1 may be in a range from about 1 micrometer to about 10 micrometers. In like manner, a second gap G2 (e.g. a second air gap) may exist between the movable element 108 and the oxide layer 126 in the cavity 112 of the capping wafer 104. In some embodiments, the second gap G2 may be substantially greater than or equal in dimension to the first gap G1.

Figure 2D:
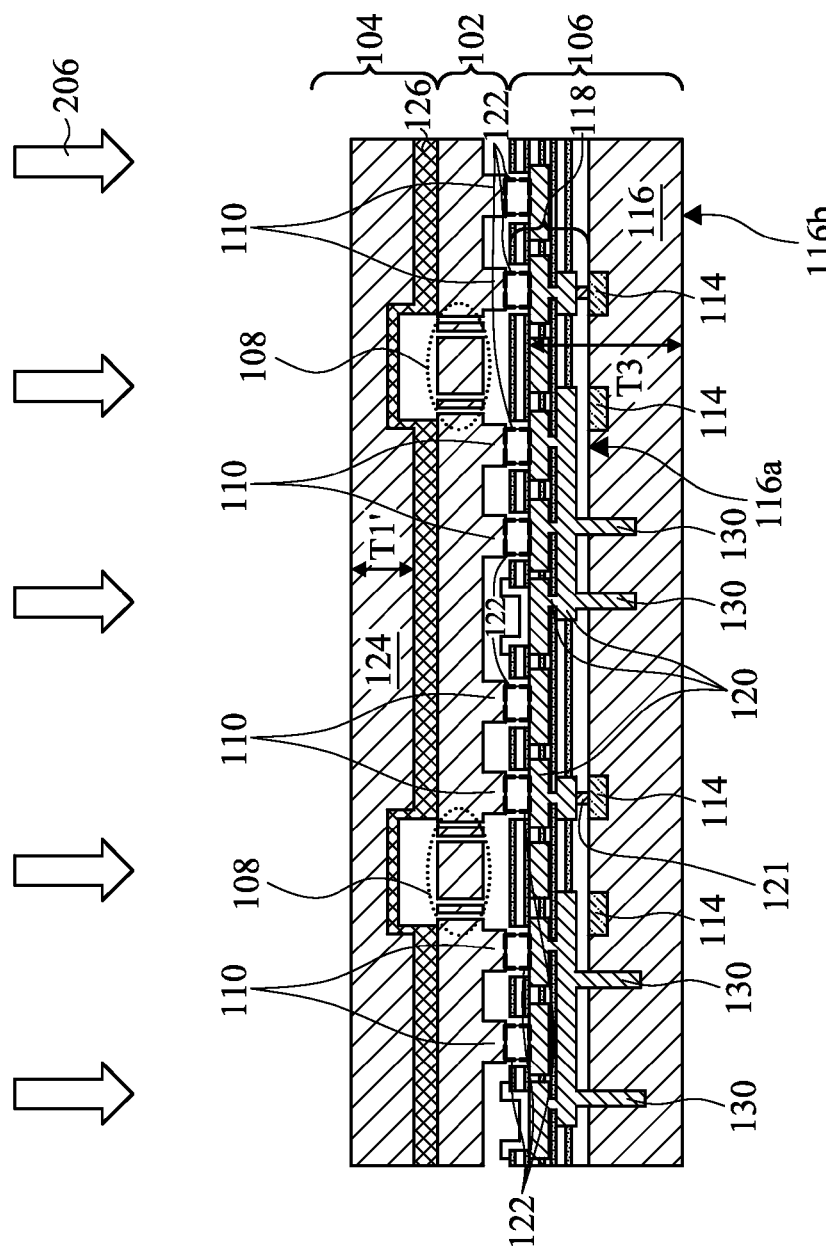

Referring to FIG. 2D, the capping wafer 104 may be thinned using a first thinning process (indicated by arrows 206). In particular, the first thickness T1 of the semiconductor substrate 124 of the capping wafer 104 may be reduced to a thinned first thickness T1' that may be in a range from about 300 micrometers to about 400 micrometers. The first thinning process may be performed using an etching process and/or a planarization process, such as a mechanical grinding process or a chemical mechanical polishing (CMP) process.

Figure 2E:
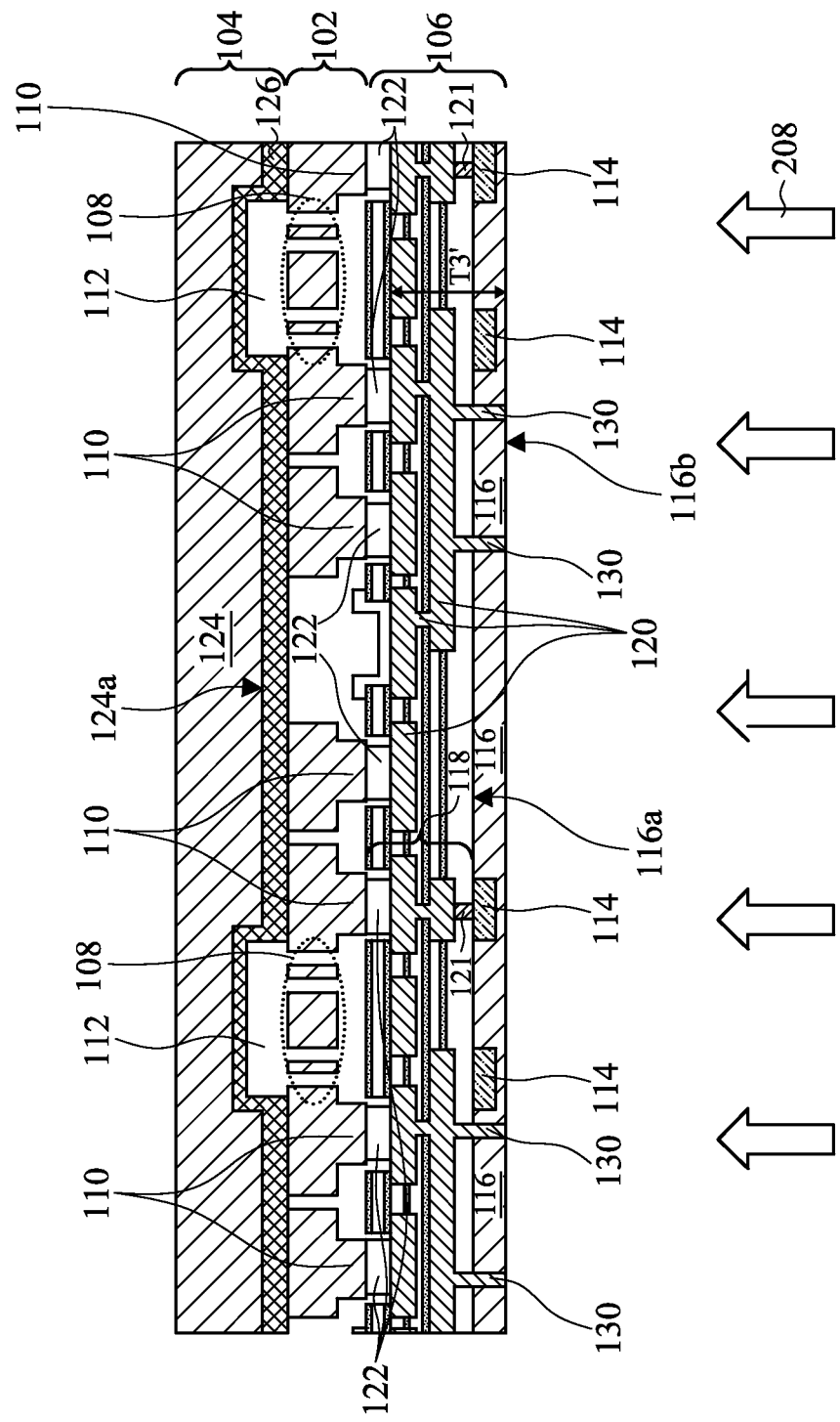

Referring to FIG. 2E, the device wafer 106 may be thinned using a second thinning process (indicated by arrows 208), which may be applied to the second major surface 116b of the substrate 116 of the device wafer 106. The second thinning process may expose the one or more via structures 130 within the substrate 116. In an embodiment, the third thickness T3 of the device wafer 106 may be reduced to a thinned third thickness T3' that may be in a range from about 50 micrometers to about 150 micrometers. The second thinning process may be performed using an etching process and/or a planarization process, such as a mechanical grinding process or a chemical mechanical polishing (CMP) process.

Figure 2F:
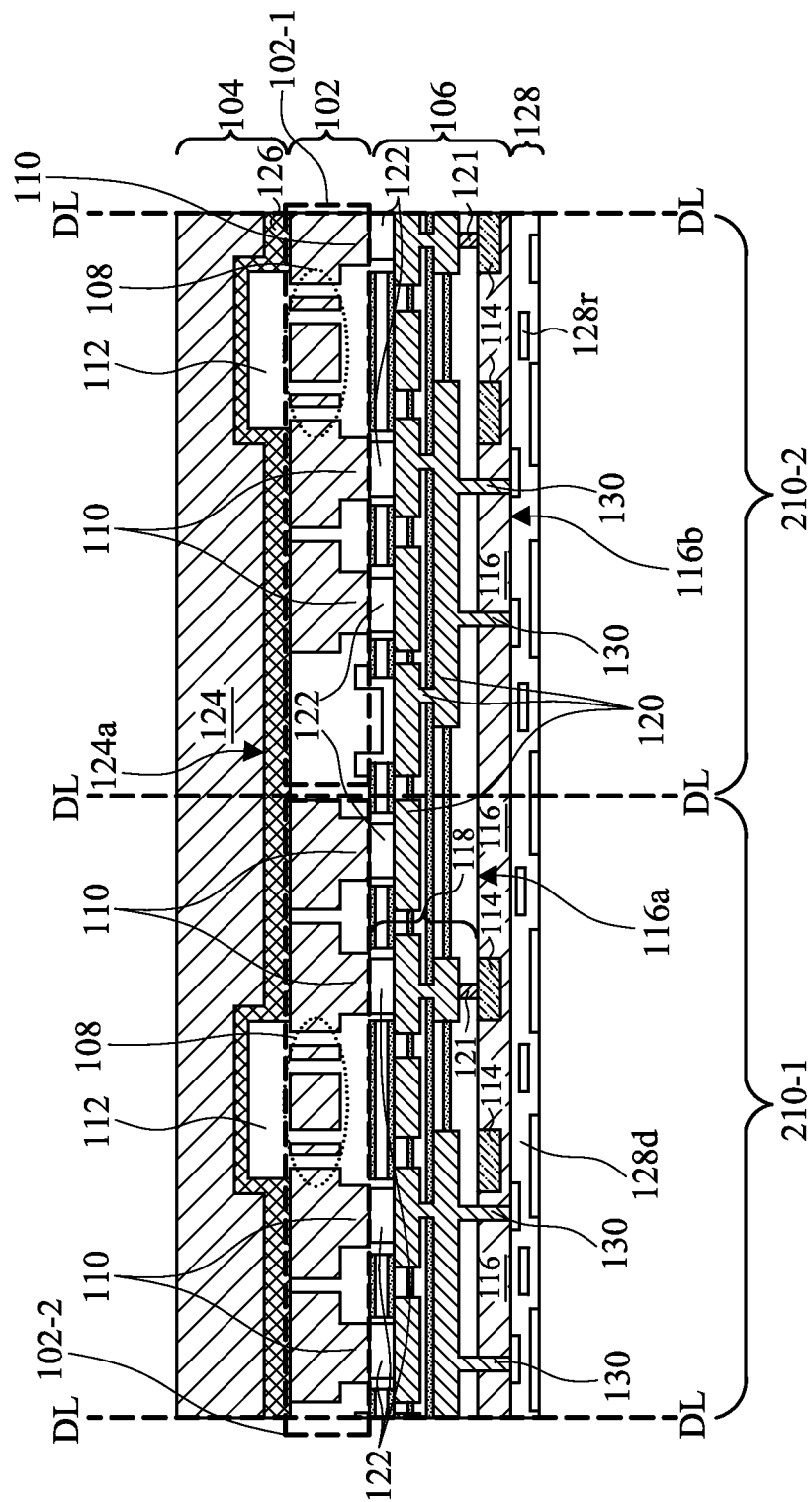

Referring to FIG. 2F, the first RDL 128 may be formed at the second major surface 116b of the substrate 116. In some embodiments, the first RDL 128 may be formed on a carrier and thereafter separated from the carrier and placed at the second major surface 116b of the substrate 116. This may be followed by a bonding process that bonds the conductive structures 128r of the first RDL 128 to the one or more via structures 130, and the insulating layer 128d of the first RDL 128 to the substrate 116. In another embodiment, however, the first RDL 128 may be formed by alternately forming insulating material (e.g. dielectric material) of the insulating layer 128d at the second major surface 116b of the substrate 116 and thereafter forming the conductive structures 128r therein. The insulating material of the insulating layer 128d may be formed by spin-on techniques, electro-chemical plating, chemical vapor deposition (CVD), physical vapor deposition (PVD), atomic layer deposition (ALD), molecular beam epitaxy CVD, or the like. The conductive structures 128r may be formed in the material of the insulating layer 128d by a deposition and etching process, a damascene process, a dual damascene process, or the like.

Following the formation of the first RDL 128, the plurality of connectors 132 (e.g. shown in FIG. 1A) or the plurality of pads 134 (e.g. shown in FIG. 1B) may be formed at a surface of the first RDL 128 facing away from the substrate 116. The plurality of connectors 132 may be formed by exposing (e.g. using an etching process) a plurality of conductive structures 128r of the first RDL 128 and forming the plurality of connectors 132 over the exposed plurality of conductive structures 128r, e.g. by mounting, printing, ball-drop, or the like. The plurality of pads 134 may be formed by exposing (e.g. using an etching process) a plurality of conductive structures 128r of the first RDL 128 and forming the plurality of connectors 132 over the exposed plurality of conductive structures 128r, e.g. by a deposition and/or plating process. The formation of the plurality of connectors 132 or the plurality of pads 134 may result in the wafer level MEMS package 100 shown in FIG. 1A or 1B, respectively. Following this, the wafer level MEMS package 100 may be diced (e.g. along dicing lines DL, shown in FIG. 2F) thereby singulating the device wafer 106, the MEMS wafer 102, and the capping wafer 104, which may result in a plurality of chip level (or chip scale) MEMS packages 210-1, 210-2. Each of the chip level MEMS packages 210-1, 210-2 may comprise a MEMS chip (e.g. obtained from the singulation of the MEMS wafer 102) having a MEMS cap thereon (e.g. obtained from the singulation of the capping wafer 104) and stacked over a device chip (e.g. obtained from the singulation of the device wafer 106).

An advantage provided by the wafer level MEMS package 100 shown in FIGS. 1A and 1B as well as the process flow illustrated in FIGS. 2A to 2F is a wafer-on-wafer level packaging solution for MEMS. Furthermore, the process flow illustrated in FIGS. 2A to 2F is a cost effective process that avoids the cost of using temporary carriers and carrier debonding. The process flow also results in a batch process that achieves high manufacturing throughput. Furthermore, the integration of a device wafer 106 that comprises one or more ASIC devices can achieve small form factor and higher performance for smart devices, mobile devices, internet-of-things (IoT) and wearable electronics, as examples. As an example, for respective chip level MEMS package, a single combo ASIC device can control multiple functions of the respective MEMS devices included in the respective chip level MEMS package. As an example, the MEMS wafer 102 comprises 6 axis motion sensor functions (3 axis in linear accelerometer, and 3 axis in gyroscope), while device wafer 106 comprises two control functions: one for controlling 3 axis linear accelerometer, the other for controlling 3 axis gyroscope.

In the embodiments shown in FIGS. 1A, 1B, and 2A to 2F, the wafer level MEMS package 100 may be a single-sided wafer level MEMS package and the chip level MEMS packages obtained therefrom may be single-sided chip level MEMS packages. In other words, one side of the device wafer 106 (e.g. a top side as shown in the orientation of FIG. 2F) has one or more devices (e.g. the plurality of MEMS devices 102-1, 102-2) stacked thereon, while another side of the device wafer 106 (e.g. a bottom side as shown in the orientation of FIG. 2F) is devoid of a stacked device. However, in some embodiments, the wafer level MEMS package may be a double-sided wafer level MEMS package, where devices are stacked on opposite sides of the device wafer 106. An example of such an embodiment is shown in FIG. 3.

FIG. 3 shows a double-sided wafer level MEMS package 300, in accordance with one or more embodiments. As shown in FIG. 3, one or more second devices 302 may be disposed at the second major surface 116b of the substrate 116 of the device wafer 106 in addition to the MEMS wafer 102 that faces the first major surface 116a of the substrate 116. In an embodiment, the one or more second devices 302 may include a MEMS device, an analog device, an energy harvesting device, a sensor device, a logic device, and/or a memory device (e.g. flash device, DRAM, SRAM, SDRAM, or the like), although other devices are possible as well. In the example of FIG. 3, the first RDL 128 is a single-level structure comprising a single layer or multiple layers or a single level or multiple levels conductive structure 128r. As an example, the single level conductive structure 128r may be a conductive trace formed at the second major surface 116b of the substrate 116.

As shown in FIG. 3, the one or more second devices 302 may be attached to the device wafer 106 by an adhesive layer 304 (e.g. an electrically non-conductive layer). As an example, the adhesive layer 304 may attach the one or more second devices 302 to the conductive structure 128r of the first RDL 128, thereby attaching the one or more second devices 302 to the device wafer 106. The adhesive layer 304 may comprise a glue, a polymer material, a die attach film (DAF), or the like.

The one or more second devices 302 may be encapsulated in a molding compound 306. The molding compound 306 may include an insulating material, which may, for example, include at least one of an epoxy material, a polyurethane material or an epoxy blend including two or more epoxy materials. For example, the molding compound 306 may include epoxy, polyimide, benzocyclobutene (BCB), polybenzoxazole (PBO), and the like. The molding compound 306 may be filled with filler particles, such as silica filler, glass filler or similar fillers.

In the example of FIG. 3, active surfaces 302a of the one or more second devices 302 may face away from the device wafer 106. Metal bumps 308 may be formed at the active surfaces 302a of the one or more second devices 302. The metal bumps 308 may comprise similar materials as the plurality of interconnect structures 120. In some embodiments, the active surfaces 302a of the one or more second devices 302 may have contact pads (e.g. I/O pads) formed thereat (not shown in FIG. 3). In such embodiments, the metal bumps 308 are disposed over and cover the contact pads of the one or more second devices 302. Also formed at the active surface 302a of a respective second device 302 is a device insulating layer 310 (e.g. comprising a dielectric material) that covers the active surface 302a and surrounds the metal bumps 308 of the respective second device 302.

The wafer level MEMS package 300 also comprises a second RDL 312 disposed at a surface of the device insulating layer 310 facing away from the one or more second devices 302. The second RDL 312 may include conductive structures 312r (e.g. contact pads, vias, conductive traces, UBMs, or the like) that may be partially or fully disposed within an insulating layer 312d (e.g. a dielectric layer). The conductive structures 312r may comprise similar materials as the plurality of interconnect structures 120.

The conductive structures 312r of the second RDL 312 may be electrically and/or physically coupled to the metal bumps 308 and may also be electrically and/or physically coupled to one or more first through-vias 314 extending through the molding compound 306. The one or more first through-vias 314 may comprise similar materials as the plurality of interconnect structures 120 and may also be electrically and/or physically coupled to the first RDL 128. Consequently, the one or more second devices 302 may be electrically connected to the plurality of interconnect structures 120 of the device wafer 106 through the metal bumps 308, the second RDL 312, the one or more first through-vias 314, the first RDL 128 and the one or more via structures 130, as shown in FIG. 3. In some embodiments, the plurality of connectors 132 or the plurality of pads 134 may be formed at a surface of the second RDL 312 facing away from the one or more second devices 302.

Figure 4A:
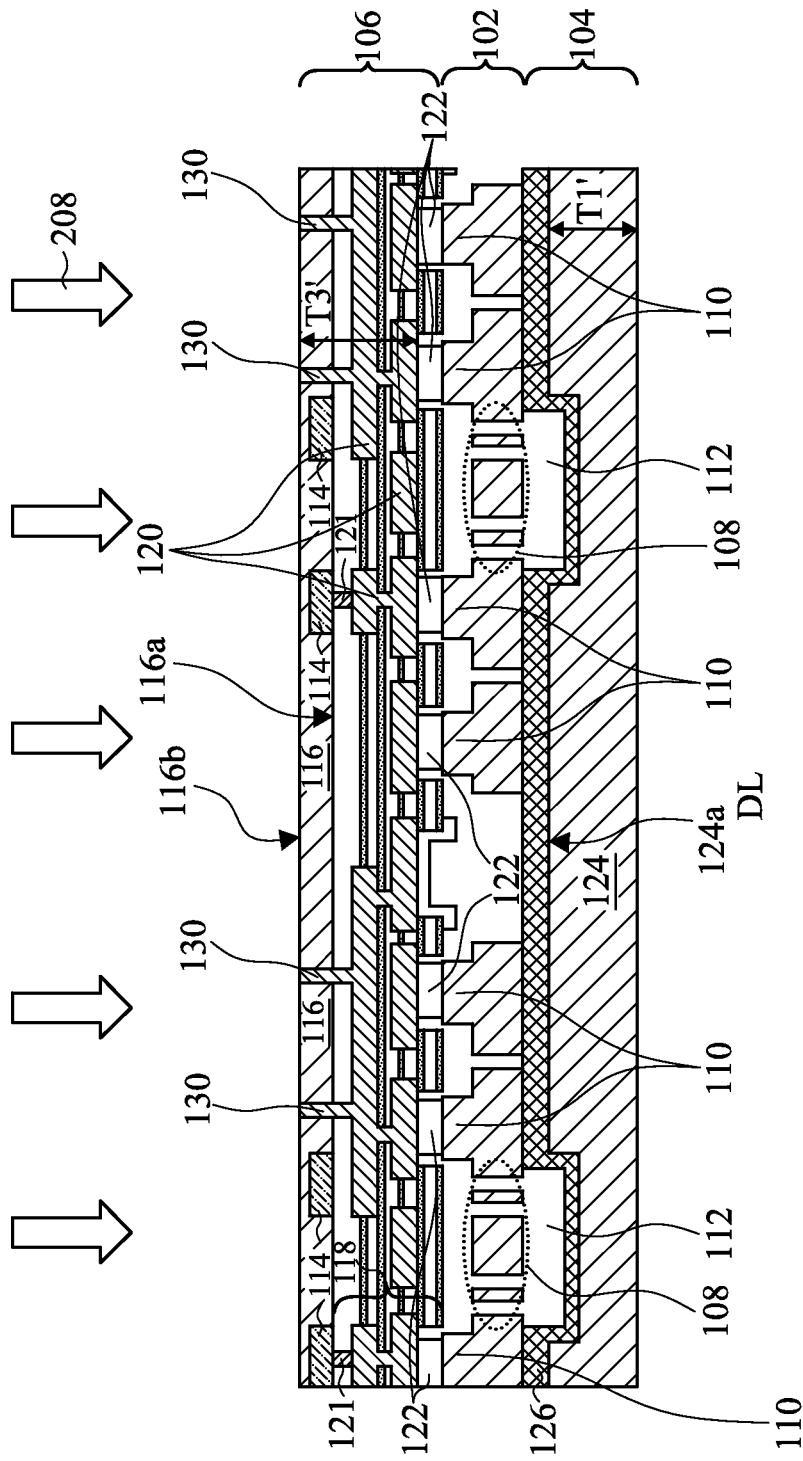
FIGS. 4A to 4F show a process flow illustrating a method of manufacturing a double-sided wafer level MEMS package, in accordance with an embodiment.

FIGS. 4A to 4F show a process flow illustrating a method of manufacturing a double-sided wafer level MEMS package, in accordance with one or more embodiments. The process flow shown in FIG. 4A to FIG. 4F may, for example, be used to manufacture the wafer level MEMS package 300 shown in FIG. 3. Referring to FIG. 4A, the structure shown may be similar to the structure shown in FIG. 2E. For example, the process flow described above in relation to FIGS. 2A to 2E may be performed to arrive at the structure shown in FIG. 4A. As shown in FIG. 4A, the device wafer 106 may be thinned using the second thinning process, which may be applied to the second major surface 116b of the substrate 116 of the device wafer 106. The second thinning process may expose the one or more via structures 130 within the substrate 116.

Figure 4B:
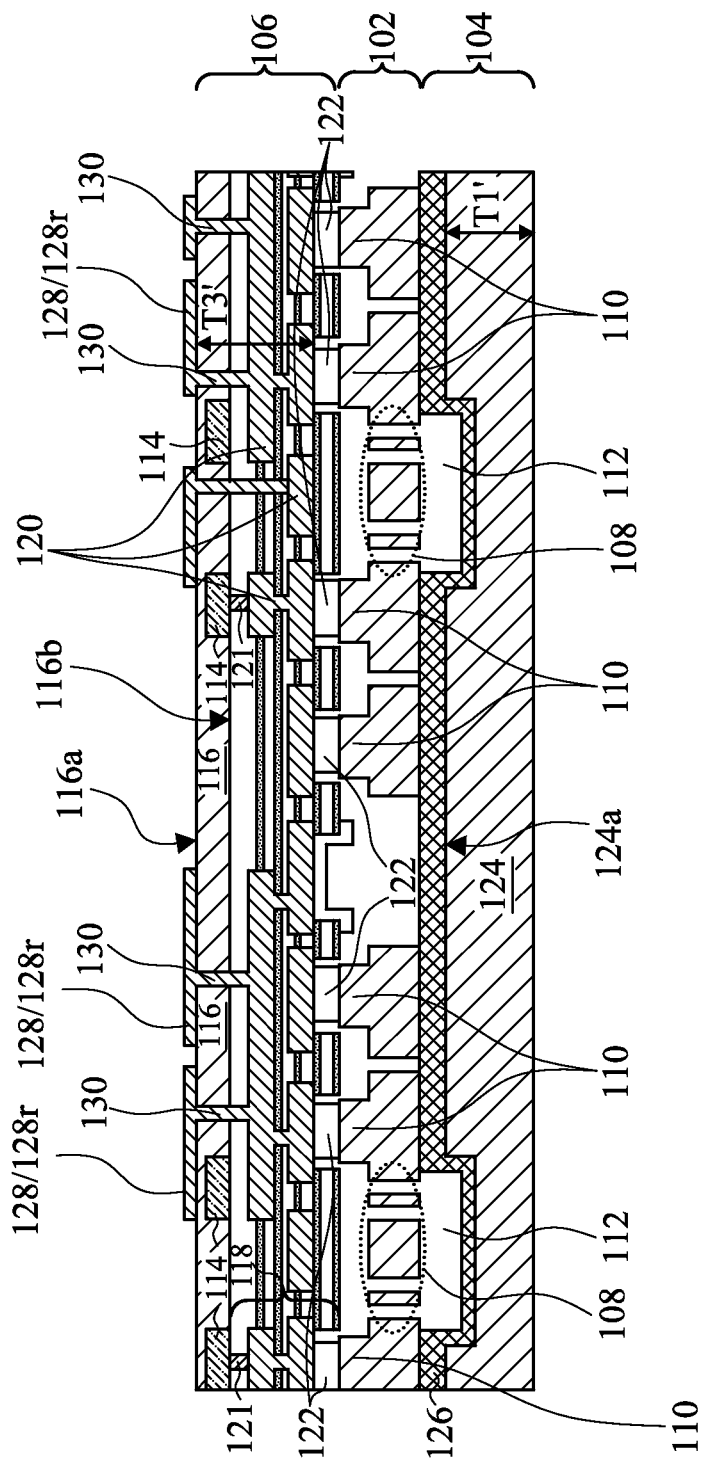

Referring to FIG. 4B, the first RDL 128 may be formed at the second major surface 116b of the substrate 116. As described above in relation to FIG. 3, the first RDL 128 in this example may be a single-level structure comprising a single layer or multiple layers or a single level or multiple levels conductive structure 128r (e.g. one or more conductive traces extending along the second major surface 116b of the substrate 116). The first RDL 128 may be formed by a plating process or by a deposition and etching process.

Figure 4C:
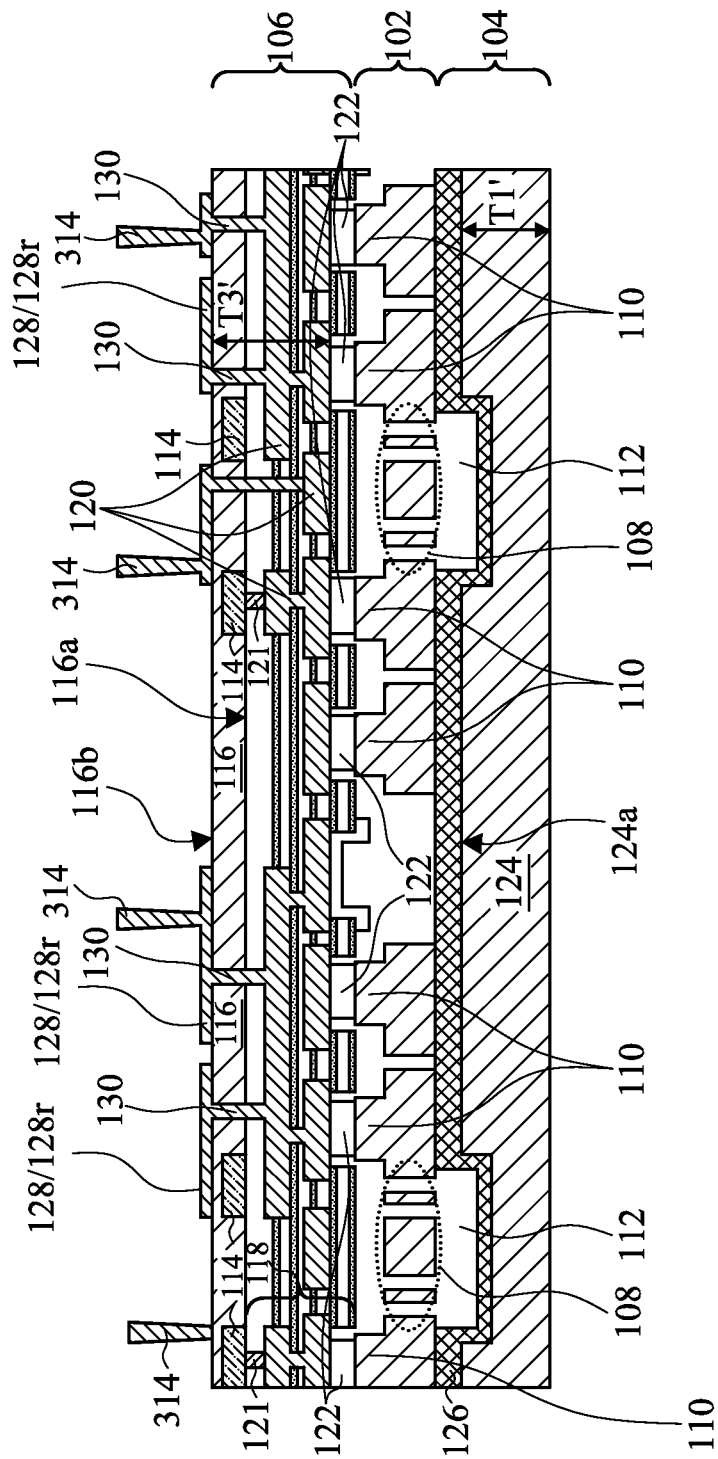

Referring to FIG. 4C, the process flow continues with the formation of the one or more first through-vias 314 over the first RDL 128. In some embodiments, the one or more first through-vias 314 may be formed directly over the first RDL 128 such that physical contact is made between the conductive structure 128r of the first RDL 128 and the one or more first through-vias 314. The one or more first through-vias 314 may be formed by any suitable techniques such as electroplating. Other processes of formation such as sputtering, evaporation, PECVD and/or the like may alternatively be used depending upon the desired materials.

Figure 4D:
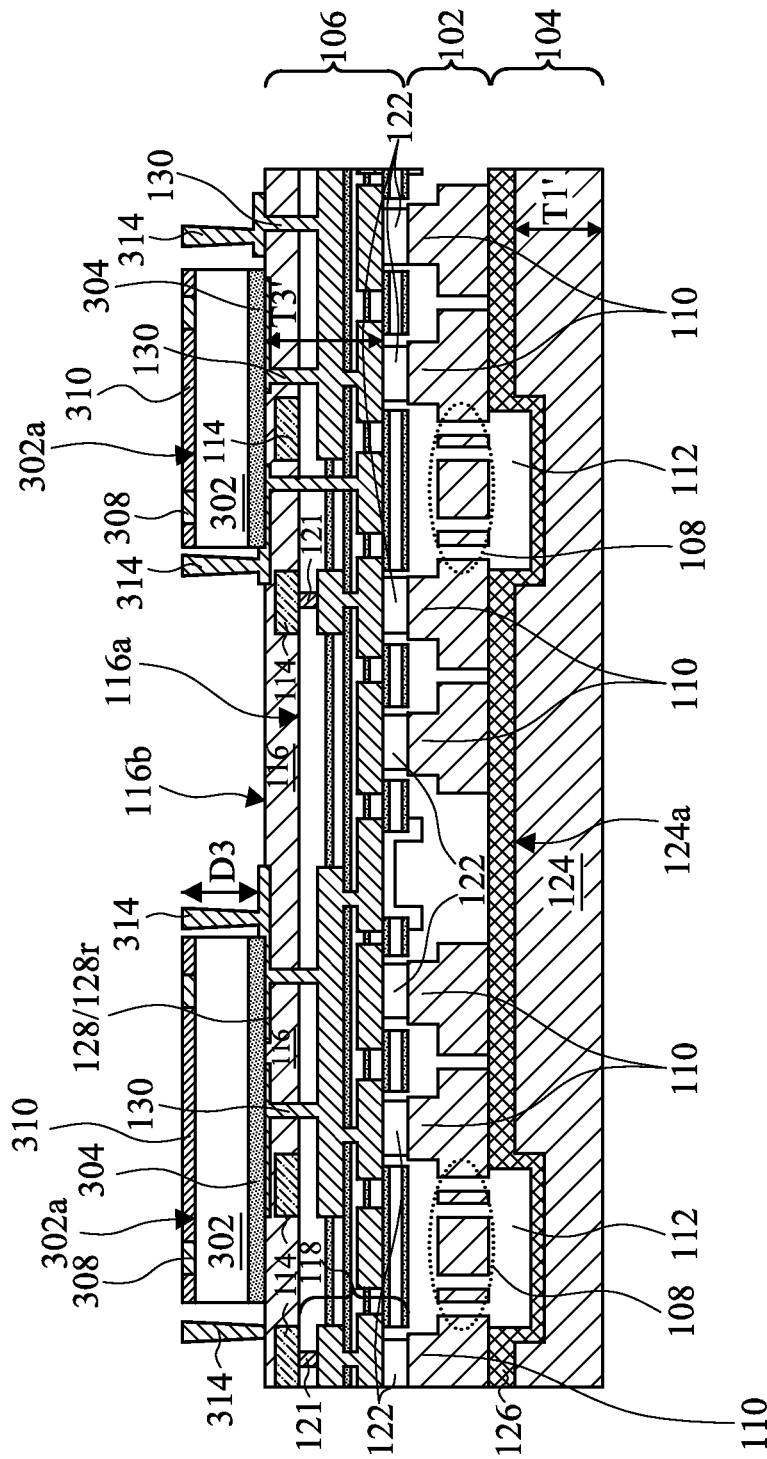

Referring to FIG. 4D, the one or more second devices 302 may be placed (e.g. using a pick and place process) over the second major surface 116b of the substrate 116. In particular, the one or more second devices 302 may be attached to the second major surface 116b of the substrate 116 by the adhesive layer 304, with the active surface 302a of the one or more second devices 302 facing away from the substrate 116. The one or more second devices 302 may be placed between adjacent via structures of the one or more first through-vias 314. Accordingly, in some embodiments, at least one via structure 314 may be laterally adjacent to a sidewall of the one or more second devices 302.

Figure 4E:
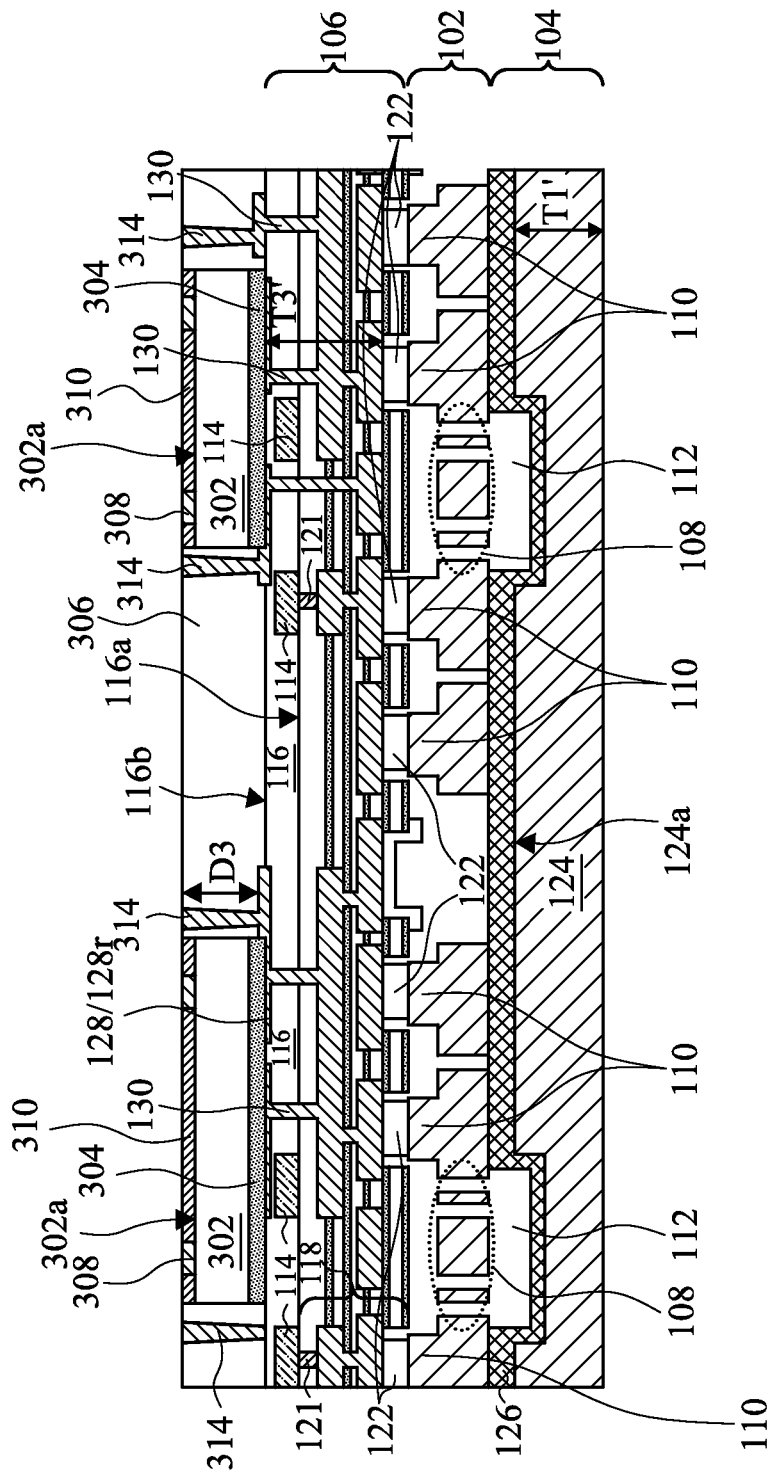

Referring to FIG. 4E, the molding compound 306 may be formed to encapsulate the one or more first through-vias 314 and the one or more second devices 302. In some embodiments, the molding compound 306 has a lateral extent that is substantially equal to a lateral extent of the device wafer 106. In some embodiments, the molding compound 306 is shaped or molded using for example, a mold (not shown) which may have a border or other feature for retaining molding compound 306 when applied. Such a mold may be used to pressure mold the molding compound 306 over the one or more first through-vias 314 and the one or more second devices 302 to force the molding compound 306 into openings, spaced, and recesses, thereby eliminating air pockets or the like in the molding compound 306.

In some embodiments, the molding compound 306 may be formed to cover the one or more first through-vias 314, the device insulating layer 310, and the metal bumps 308. Accordingly, a thinning process may be performed on the molding compound 306 to expose the one or more first through-vias 314, the device insulating layer 310, and the metal bumps 308. The thinning process may be performed using an etching process and/or a planarization process, such as a mechanical grinding process or a chemical mechanical polishing (CMP) process. In some embodiments, portions of the one or more first through-vias 314, the device insulating layer 310, and the metal bumps 308 may also be removed by the thinning process. Consequently, surfaces of the one or more first through-vias 314, the device insulating layer 310, and the metal bumps 308 may be substantially co-planar with a surface of the molding compound 306. Furthermore, as a result of the thinning process, the one or more first through-vias 314 may extend from the second major surface 116b of the substrate 116 by a third distance D3, which may be in a range from about 5 micrometers to about 10 micrometers.

Figure 4F:
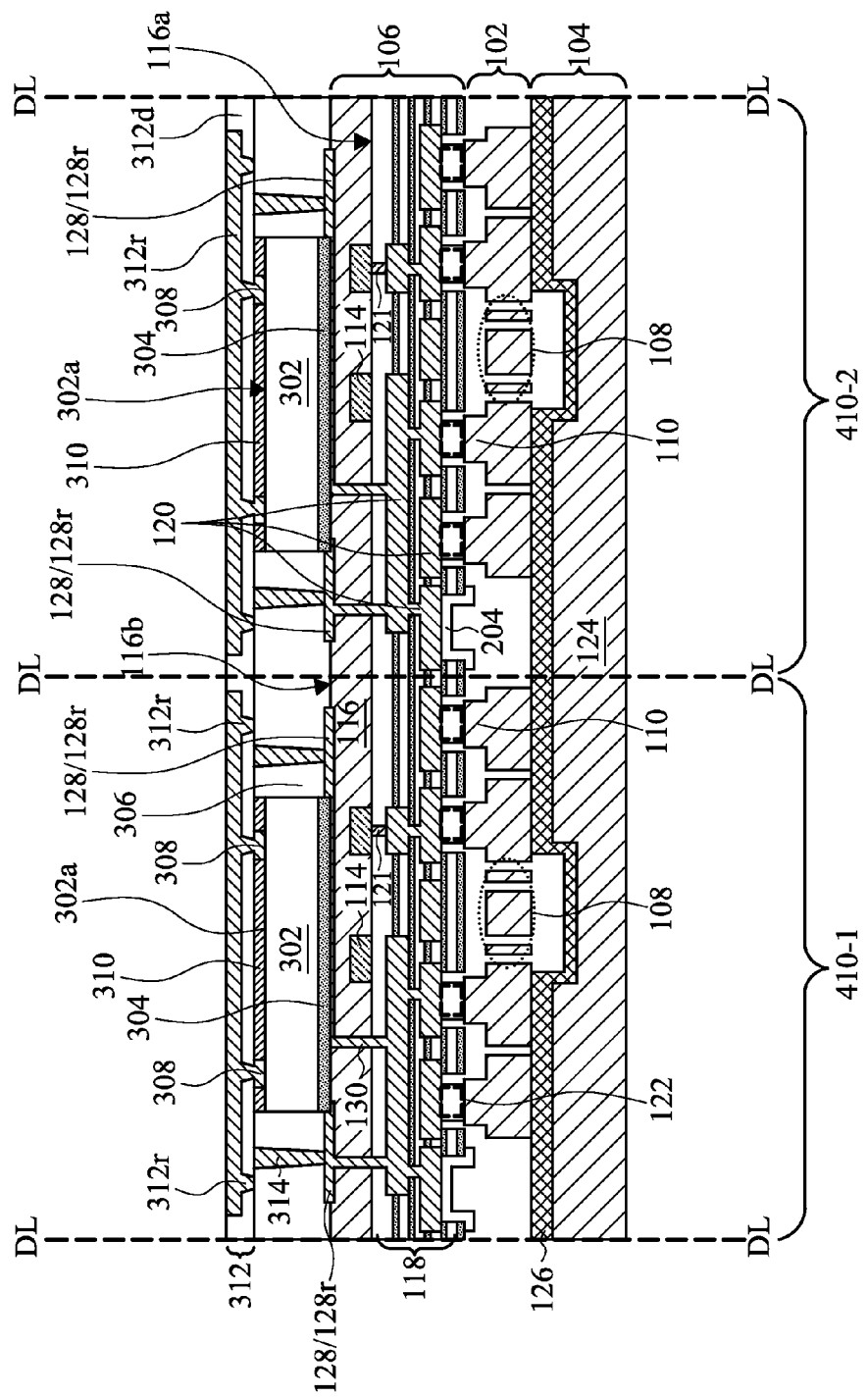

Referring to FIG. 4F, the process flow continues with the formation of the second RDL 312 at a surface of the molding compound 306 facing away from the device wafer 106. In some embodiments, the second RDL 312 may be formed on a carrier and thereafter separated from the carrier and placed at the surface of the molding compound 306 facing away from the device wafer 106. This may be followed by a bonding process that bonds the conductive structures 312r of the second RDL 312 to the one or more first through-vias 314 and the metal bumps 308, and the insulating layer 312d of the second RDL 312 to the material of the molding compound 306. In another embodiment, however, the second RDL 312 may be formed by alternately forming insulating material (e.g. dielectric material) of the insulating layer 312d at the surface of the molding compound 306 facing away from the device wafer 106 and thereafter forming the conductive structures 312r therein. The insulating material of the insulating layer 312d may be formed by spin-on techniques, electro-chemical plating, chemical vapor deposition (CVD), physical vapor deposition (PVD), atomic layer deposition (ALD), molecular beam epitaxy CVD, or the like. The conductive structures 312r may be formed in the material of the insulating layer 312d by a deposition and etching process, a damascene process, a dual damascene process, or the like.

Following the formation of the second RDL 312, the plurality of connectors 132 (e.g. shown in FIG. 1A) or the plurality of pads 134 (e.g. shown in FIG. 1B) may be formed at a surface of the second RDL 312 facing away from the substrate 116, e.g. using similar processes described above in respect of FIG. 2F. Following this, the double-sided wafer level MEMS package 300 may be diced (e.g. along dicing lines DL, shown in FIG. 4F) thereby singulating the device wafer 106, the MEMS wafer 102, the capping wafer 104, and the molding compound 306 having the one or more second devices 302 therein. This may result in a plurality of double-sided chip level MEMS packages 410-1, 410-2. Each of the double-sided chip level MEMS packages 410-1, 410-2 may comprise a MEMS chip (e.g. e.g. obtained from the singulation of the MEMS wafer 102) having a MEMS cap thereon (e.g. obtained from the singulation of the capping wafer 104) and stacked over a first surface of a first device chip (e.g. obtained from the singulation of the device wafer 106). In addition, a second surface of the device chip may have a second device chip thereat (e.g. the second device 302).

An advantage provided by the wafer level MEMS package 300 shown in FIG. 3 as well as the process flow illustrated in FIGS. 4A to 4F is a wafer-on-wafer level packaging solution for MEMS. Furthermore, the process flow illustrated in FIGS. 4A to 4F is a cost effective process that avoids the cost of using temporary carriers and carrier debonding. The process flow also results in a batch process that achieves high manufacturing throughput. Furthermore, the integration of a device wafer 106 that comprises one or more ASIC devices can achieve small form factor and higher performance for smart devices, mobile devices, internet-of-things (IoT) and wearable electronics, as examples. As an example, for respective chip level MEMS package, a single combo ASIC device can control multiple functions of the respective MEMS device included in the respective chip level MEMS package.

In the embodiments shown in FIGS. 1A, 1B, 2A to 2F, 3, and 4A to 4F, a wafer level MEMS structure (e.g. MEMS wafer 102) is bonded or attached to a wafer level device structure (e.g. device wafer 106), e.g. using the plurality of inter-wafer connectors 122. In these embodiments, the MEMS wafer 102, the device wafer 106, and the capping wafer 104 are singulated to form a plurality of chip level MEMS packages. However, there may be other embodiments where a chip level MEMS structure having a chip level capping structure is bonded or attached to a wafer level device structure (e.g. the device wafer 106). Consequently, in forming the plurality of chip level MEMS packages, only the wafer level device structure (e.g. device wafer 106) may need to be singulated. An example of such an embodiment is shown in FIG. 5.

Figure 5:
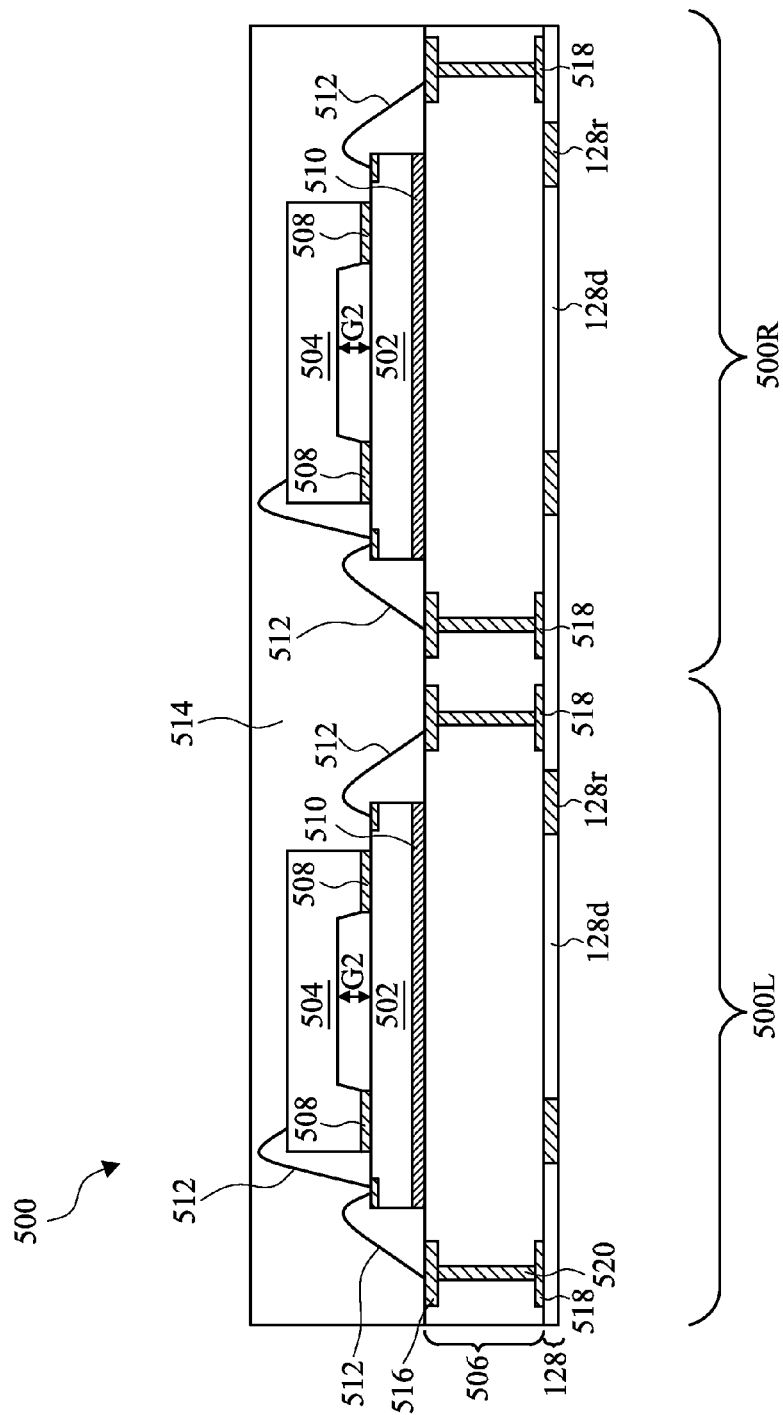
FIG. 5 shows a single-sided chip-on-wafer MEMS package, in accordance with an embodiment.

FIG. 5 shows a chip-on-wafer MEMS package 500 comprising MEMS chips 502 stacked over a device wafer 506, in accordance with one or more embodiments. Only two MEMS chips 502 are shown as an example; however, the number of MEMS chips 502 may be more than two (e.g. three, four, five, etc.) in other embodiments. Each of the MEMS chips 502 may, as an example, be identified with the one of the plurality of MEMS devices 102-1, 102-2 of the MEMS wafer 102 described above in respect of FIGS. 1A, 1B, 2A to 2F, 3, and 4A to 4F. Furthermore, the device wafer 506 may, as an example, be identified with the device wafer 106 described above in respect of FIGS. 1A, 1B, 2A to 2F, 3, and 4A to 4F. Consequently, the MEMS chips 502 and the device wafer 506 in FIG. 5 are simplified illustrations of the MEMS device 102-1 or 102-2 and the device 106, respectively. This has been done for the sake of simplicity and to aid in highlighting pertinent features of the embodiment shown in FIG. 5.

As shown in FIG. 5, each of the MEMS chips 502 may be capped by a MEMS cap 504, which may be disposed over one or more movable elements 108 that may be formed in the MEMS chip 502. The MEMS cap 504 may be a chip level structure that may serve to seal (e.g. hermetically seal) the one or more movable elements 108 of the MEMS chip 502, while providing the second gap G2 between a surface of the MEMS cap 504 and a surface of the MEMS chip 502 facing the MEMS cap 504. The MEMS cap 504 differs from the capping wafer 104 in that the MEMS cap 504 may be a chip level capping structure while the capping wafer 104 may be a wafer level capping structure. The MEMS cap 504 may comprise similar materials as the capping wafer 104.

Illustratively, each of the MEMS chips 502 may be obtained by singulating the MEMS wafer 102 and attaching each of the singulated MEMS devices to the device wafer 506 such that the singulated MEMS devices are laterally separated from each other. Also, the MEMS cap 504 may be formed over a respective singulated MEMS device by singulating the capping wafer 104 covering the singulated MEMS device with the singulated MEMS cap. The MEMS cap 504 may be bonded or attached to the MEMS chip 502 by a plurality of inter-chip connectors 508 disposed between the MEMS cap 504 and the MEMS chip 502. The plurality of inter-chip connectors 508 may comprise similar materials as the plurality of inter-wafer connectors 122. The MEMS chip 502 may be attached to the device wafer 506 by an adhesive layer 510, which may be similar in composition to the adhesive layer 304 described above in respect of FIGS. 1A, 1B, 2A to 2F, 3, and 4A to 4F.

As shown in FIG. 5, the MEMS chip 502 and the MEMS cap 504 may be electrically connected to each other and to the device wafer 506 by a plurality of wire bonds 512, which may comprise copper, gold, aluminum, an alloy thereof, or the like. The MEMS chip 502, the MEMS cap 504, the adhesive layer 510 and the plurality of wire bonds 512 may be encapsulated in a molding compound 514, which may be similar in composition to the molding compound 306 described above in relation to FIG. 3.

The plurality of wire bonds 512 may be electrically and/or physically connected to first pads 516 of the device wafer 506, which may be disposed at a surface of the device wafer 506 facing the MEMS chip 502. The first pads 516 may be electrically connected to second pads 518 disposed at a surface of the device wafer 506 facing away from the MEMS chip 502 by one or more second through-wafer vias 520 extending through the device wafer 506 and between the first pads 516 and the second pads 518. The one or more second through-wafer vias 520, the first pads 516, and the second pads 518 may comprise similar materials as the plurality of wire bond 512.

As described above, the device wafer 506 may, as an example, be identified as a simplified illustration of the device wafer 106 described above in respect of FIGS. 1A, 1B, 2A to 2F, 3, and 4A to 4F. Accordingly, the one or more second through-wafer vias 520 may, as an example, extend through the substrate 116 and the plurality of dielectric layers 118 of the device wafer 106 shown in FIGS. 1A, 1B, 2A to 2F, 3, and 4A to 4F to electrically connect the first pads 516 and the second pads 518, which may, as an example, be formed at the second major surface 116b of the substrate 116 and the metal layer farthest in distance from the substrate 116 (e.g. topmost metal layer), respectively.

In some embodiments, the surface of the device wafer 506 facing the MEMS chip 502 may be a front side of the device wafer 506. In such an embodiment, the first pads 516 of the device wafer 506 may be front side pads of the device wafer 506. In another embodiment, the surface of the device wafer 506 facing away from the MEMS chip 502 may be the front side of the device wafer 506. In this embodiment, the second pads 518 of the device wafer 506 may be the front side pads of the device wafer 506. The chip-on-wafer MEMS package 500 shown in FIG. 5 also includes the first RDL 128 comprising the conductive structures 128r and the insulating layer 128d. The first RDL 128 may be formed at the surface of the device wafer 506 facing away from the MEMS chip 502. In some embodiments, the plurality of connectors 132 (e.g. BGA) or the plurality of pads 134 (e.g. LGA) may be formed at the surface of the first RDL 128 facing away from the device wafer 106. These structures are not shown in FIG. 5 for the sake of simplicity.

FIGS. 6A to 6E show a process flow illustrating a method of manufacturing a chip-on-wafer MEMS, in accordance with one or more embodiments. The process flow shown in FIG. 6A to FIG. 6E may, for example, be used to manufacture the chip-on-wafer MEMS package 500 shown in FIG. 5. Furthermore, for the sake of simplicity, the process flow illustrated in FIGS. 6A to 6E show one side (e.g. a left side 500L) of the arrangement shown in FIG. 5. However, it should be understood that the processes described may be simultaneously applied to both sides 500L and 500R of the structure shown in FIG. 5.

Figure 6A:
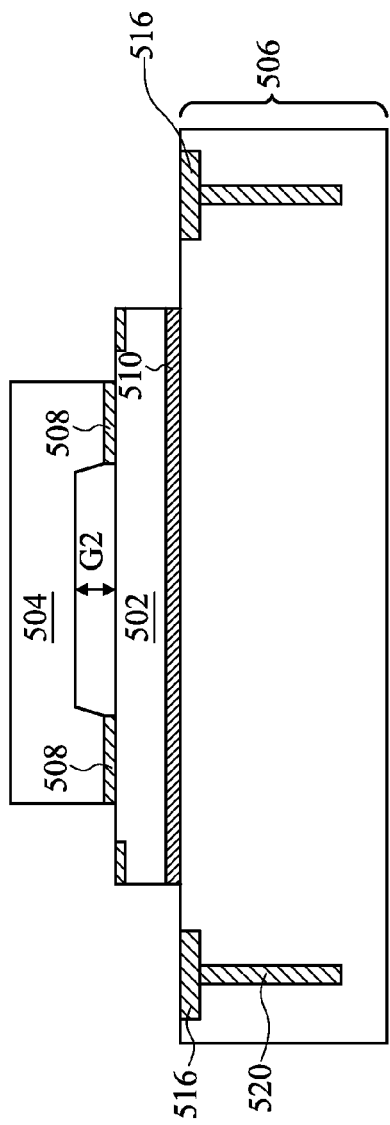
FIGS. 6A to 6E show a process flow illustrating a method of manufacturing a single-sided chip-on-wafer MEMS package, in accordance with an embodiment.

Referring to FIG. 6A, the MEMS chip 502 having the MEMS cap 504 thereon may be attached or bonded (e.g. using a pick and place process) to the device wafer 506 using the adhesive layer 510. As an example, the MEMS chip 502 may be bonded to the surface of the device wafer 506 having the first pads 516 formed thereat. As shown in FIG. 6A, at this stage of the process flow, the one or more second through-wafer vias 520 extend partially into the device wafer 506 (e.g. into an interior region of the device wafer 506) from the surface of the device wafer 506 having the first pads 516.

Figure 6B:
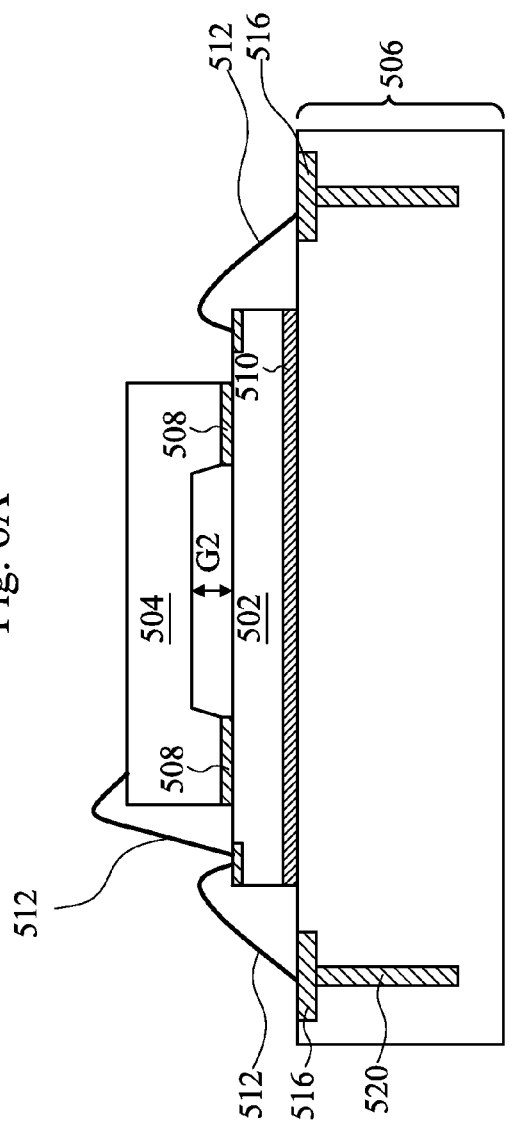
Figure 6C:
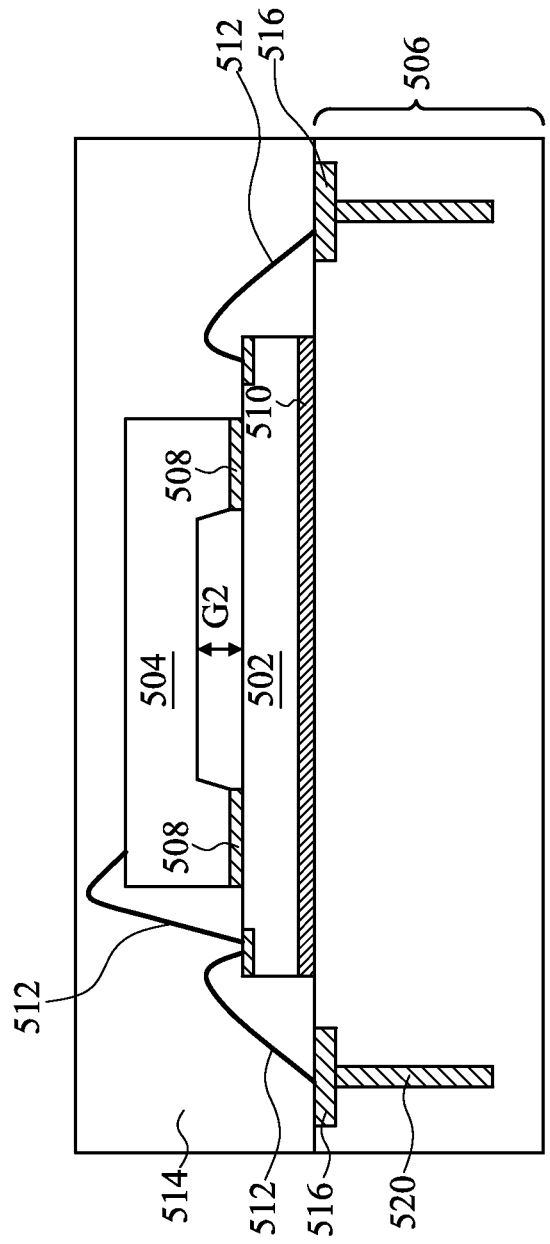

Referring to FIG. 6B, the plurality of wire bonds 512 may be formed to interconnect the MEMS cap 504 and the MEMS chip 502 to each other and to the device wafer 506. Referring to FIG. 6C, the molding compound 514 may be formed over the device wafer 506 to encapsulate the plurality of wire bonds 512, the MEMS cap 504, the MEMS device 502, and the adhesive layer 510. The process used may be similar to that described above in FIG. 4E in relation to the formation of molding compound 306.

Figure 6D:
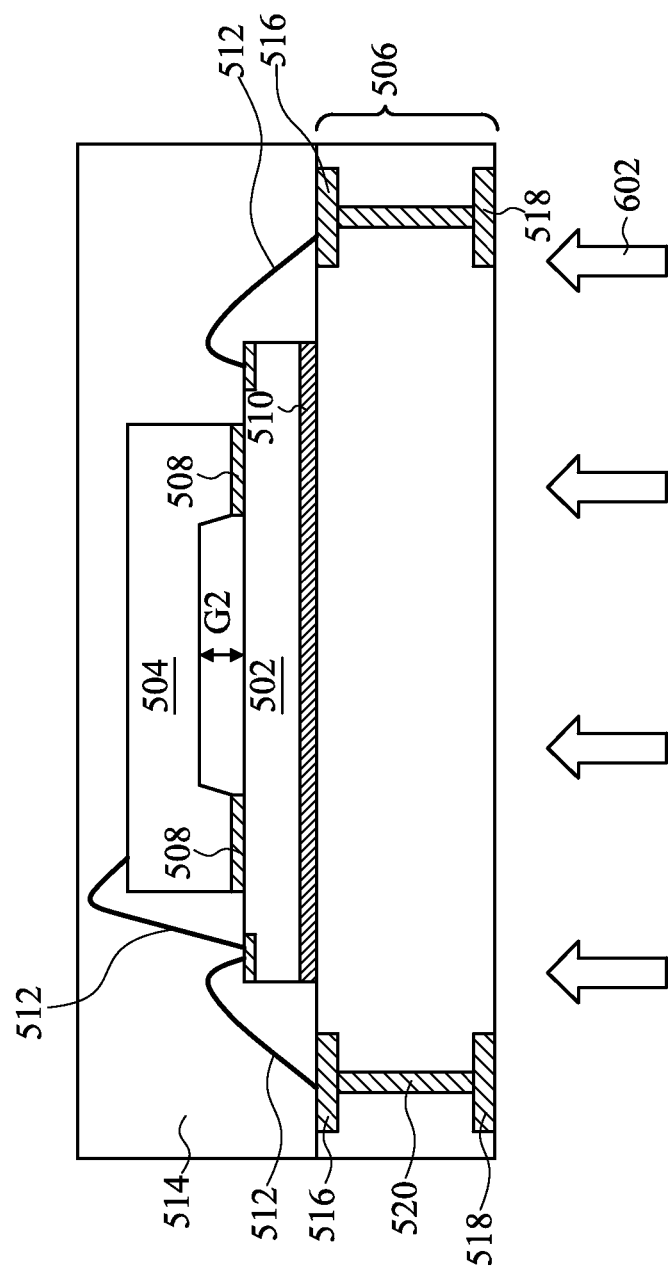

Following this, as shown in FIG. 6D, the device wafer 506 may be thinned using a third thinning process (indicated by arrows 602), which may be applied to the surface of the device wafer 506 facing away from the MEMS chip 502. The third thinning process 602 may expose the one or more second through-wafer vias 520. Furthermore, the second pads 518 may be formed over exposed portions of the one or more second through-wafer vias 520 (e.g. by a plating process or by a deposition and etching process). The third thinning process 602 may be performed using an etching process and/or a planarization process, such as a mechanical grinding process or a chemical mechanical polishing (CMP) process.

Figure 6E:
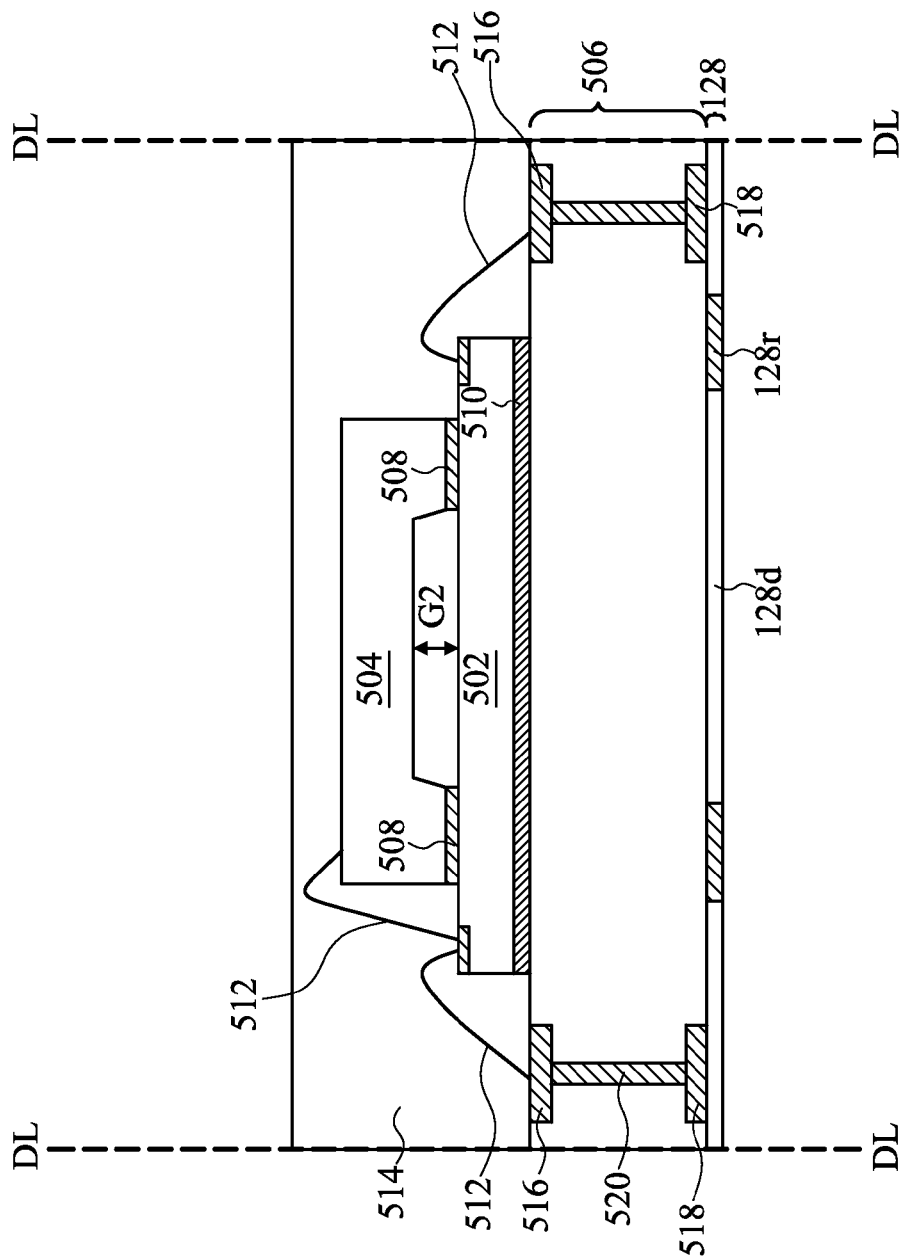

Referring to FIG. 6E, the first RDL 128 may be formed at the surface of the device wafer 506 having the second pads 518 formed thereat. In some embodiments, the first RDL 128 may be formed on a carrier and thereafter separated from the carrier and placed at the surface of the device wafer 506 having the second pads 518. In another embodiment, however, the first RDL 128 may be formed by alternately forming insulating material (e.g. dielectric material) of the insulating layer 128*d* at the surface of the device wafer 506 having the second pads 518 and thereafter forming the conductive structures 128*r* therein. The insulating layer 128*d* and the conductive structures 128*r* of the first RDL 128 may be formed by similar processes described above in respect of FIG. 2F.

Following the formation of the first RDL 128, the plurality of connectors 132 (e.g. shown in FIG. 1A) or the plurality of pads 134 (e.g. shown in FIG. 1B) may be formed at a surface of the first RDL 128 facing away from the device wafer 506, e.g. using the processes described above in respect of FIG. 2F. Following this, the chip-on-wafer MEMS package 500 may be diced (e.g. along dicing lines DL, shown in FIG. 6E) thereby resulting in a plurality of chip level MEMS packages.

An advantage provided by the wafer level MEMS package 500 shown in FIG. 5 as well as the process flow illustrated in FIGS. 6A to 6E is a chip-on-wafer level packaging solution for MEMS. Furthermore, the process flow illustrated in FIGS. 6A to 6E is a cost effective process that avoids the cost of using temporary carriers and carrier debonding. The process flow also results in a batch process that achieves high manufacturing throughput. Furthermore, the integration of a device wafer 106 that comprises one or more ASIC devices can achieve small form factor and higher performance for smart devices, mobile devices, internet-of-things (IoT) and wearable electronics, as examples. As an example, for respective chip level MEMS package, a single combo ASIC device can control multiple functions of the respective MEMS device included in the respective chip level MEMS package.

In the embodiments shown in FIGS. 5 and 6A to 6E, the chip-on-wafer MEMS package 500 may be a single-sided chip-on-wafer MEMS package. In other words, one side of the device wafer 506 has a chip-level structure (e.g. the MEMS chip 502) stacked thereon, while another side of the device wafer 506 is devoid of a stacked device. However, in some embodiments, the chip-on-wafer MEMS package may be a double-sided chip-on-wafer MEMS package, where chip-level structures are stacked on opposite dies of the device wafer 506. An example of such an embodiment is shown in FIG. 7.

Figure 7:
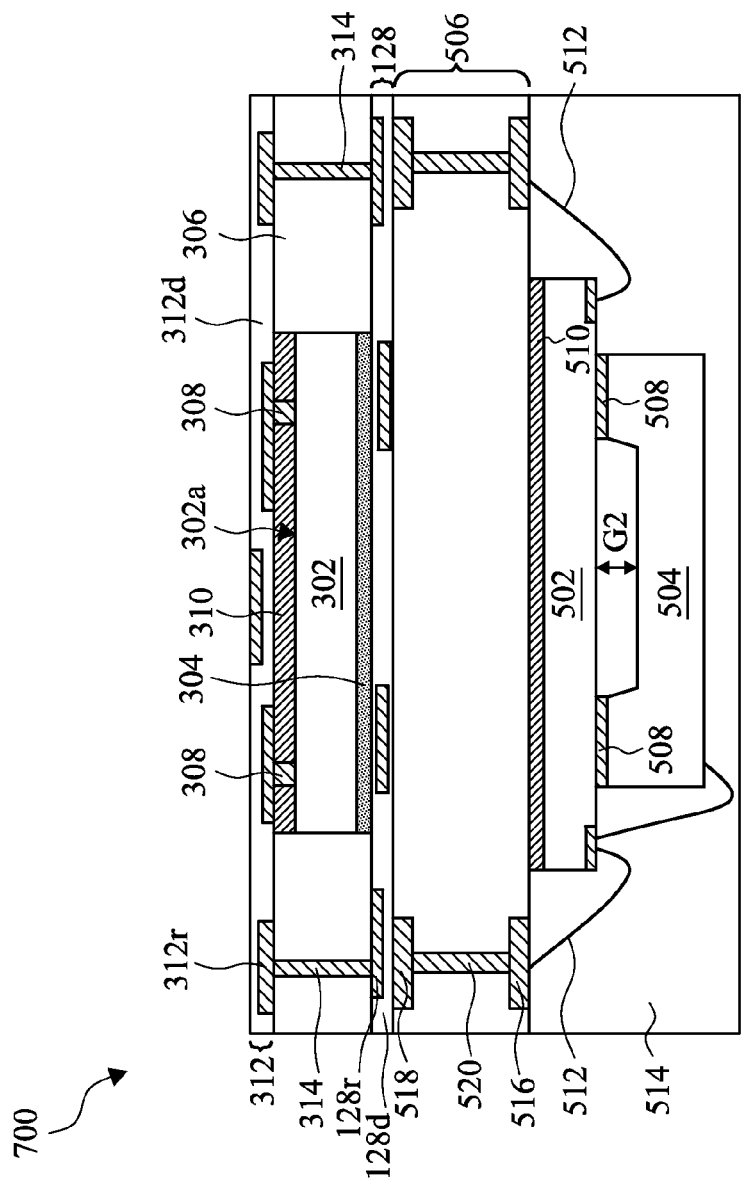
FIG. 7 shows a double-sided chip-on-wafer MEMS package, in accordance with an embodiment.

FIG. 7 shows a double-sided chip-on-wafer MEMS package 700, in accordance with one or more embodiments. It is noted that only one side (e.g. a left side) of the double-sided chip-on-wafer MEMS package 700 is shown, and the double-sided chip-on-wafer MEMS package 700 shown in FIG. 7 may be replicated to the left or right (e.g. as in FIG. 5). As shown in FIG. 7, the second device 302 may be formed at the surface of the first RDL 128 facing away from the MEMS chip 502. Consequently, the device wafer 506 may be disposed between the MEMS chip 502 and the second device 302. In an embodiment, the second device 302 may include a MEMS device, an energy harvesting device, a sensor device, a logic device, an analog device, or a memory device (e.g. flash device, DRAM, SRAM, SDRAM, or the like), although other devices are possible as well. In the example of FIG. 7, the first RDL 128 is a multi-level structure comprising conductive structures 128*r* disposed across a plurality of layers or levels. However, in some embodiments, the first RDL 128 may be a single level structure comprising a single level conductive structure 128*r*, which may be a conductive trace.

As shown in FIG. 7, the second device 302 may be attached to the device wafer 506 by the adhesive layer 304. As an example, the adhesive layer 304 may attach the one or more second devices 302 to the insulating layer 128*d* of the first RDL 128, thereby attaching the second device 302 to the device wafer 506.

The second device 302 may be encapsulated in the molding compound 306. In the example of FIG. 7, the active surface 302*a* of the second device 302 may face away from the device wafer 506. Metal bumps 308 may be formed at the active surface 302*a* of the second device 302. In some embodiments, the active surface 302*a* of the second device 302 may have contact pads (e.g. I/O pads) formed thereon (not shown in FIG. 7). In such embodiments, the metal bumps 308 are disposed over and cover the contact pads of the second device 302. Also formed at the active surface 302a is the device insulating layer 310 (e.g. comprising a dielectric material) that covers the active surface 302a and surrounds the metal bumps 308 of the second device 302.

The double-sided chip-on-wafer MEMS package 700 also comprises the second RDL 312 disposed at the surface of the device insulating layer 310 facing away from the second device 302. The second RDL 312 may include conductive structures 312r (e.g. contact pads, vias, conductive traces, UBMs, or the like) that may be partially or fully disposed within the insulating layer 312d (e.g. a dielectric layer).

The conductive structures 312r of the second RDL 312 may be electrically and/or physically coupled to the metal bumps 308 and may also be electrically and/or physically coupled to the one or more first through-vias 314 extending through the molding compound 306. The one or more first through-vias 314 may be electrically and/or physically coupled to the first RDL 128. Consequently, the second device 302 may be electrically connected to the device wafer 506 through the metal bumps 308, the second RDL 312, the one or more first through-vias 314, and the first RDL 128. Furthermore, the second device 302 may be electrically connected to the MEMS chip 502 through the metal bumps 308, the second RDL 312, the one or more first through-vias 314, the first RDL 128, the second pads 518, the one or more second through-wafer vias 520, the first pads 516, and the plurality of wire bonds 512. In some embodiments, the plurality of connectors 132 or the plurality of pads 134 may also be formed at a surface of the second RDL 312 facing away from the second device 302.

Figure 8A:
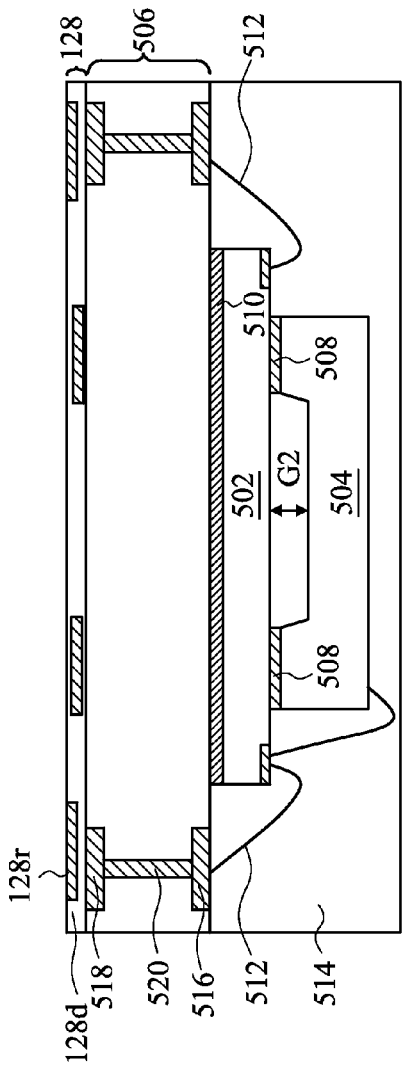
FIGS. 8A to 8E show a process flow illustrating a method of manufacturing a double-sided chip-on-wafer MEMS package, in accordance with an embodiment.

FIGS. 8A to 8E show a process flow illustrating a method of manufacturing a double-sided chip-on-wafer MEMS package, in accordance with one or more embodiments. As an example, the process flow shown in FIGS. 8A to 8E may be used to manufacture the double-sided chip-on-wafer MEMS package 700 shown in FIG. 7. Referring to FIG. 8A, the structure shown may be similar to the structure shown in FIG. 6E. For example, the process flow described above in relation to FIGS. 6A to 6E may be performed to arrive at the structure shown in FIG. 8A. As shown in FIG. 8A, the first RDL 128 may be formed at the surface of the device wafer 506 having the second pads 518 formed thereat.

Figure 8B:
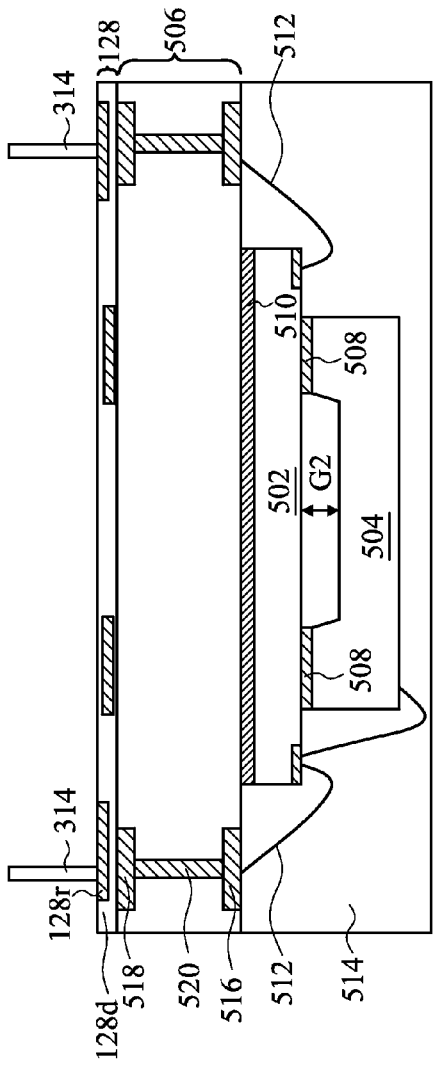

Referring to FIG. 8B, the process flow continues with the formation of the one or more first through-vias 314 over the first RDL 128. The formation of the one or more first through-vias 314 in FIG. 8B may be similar to the process described above in relation to FIG. 4C.

Figure 8C:
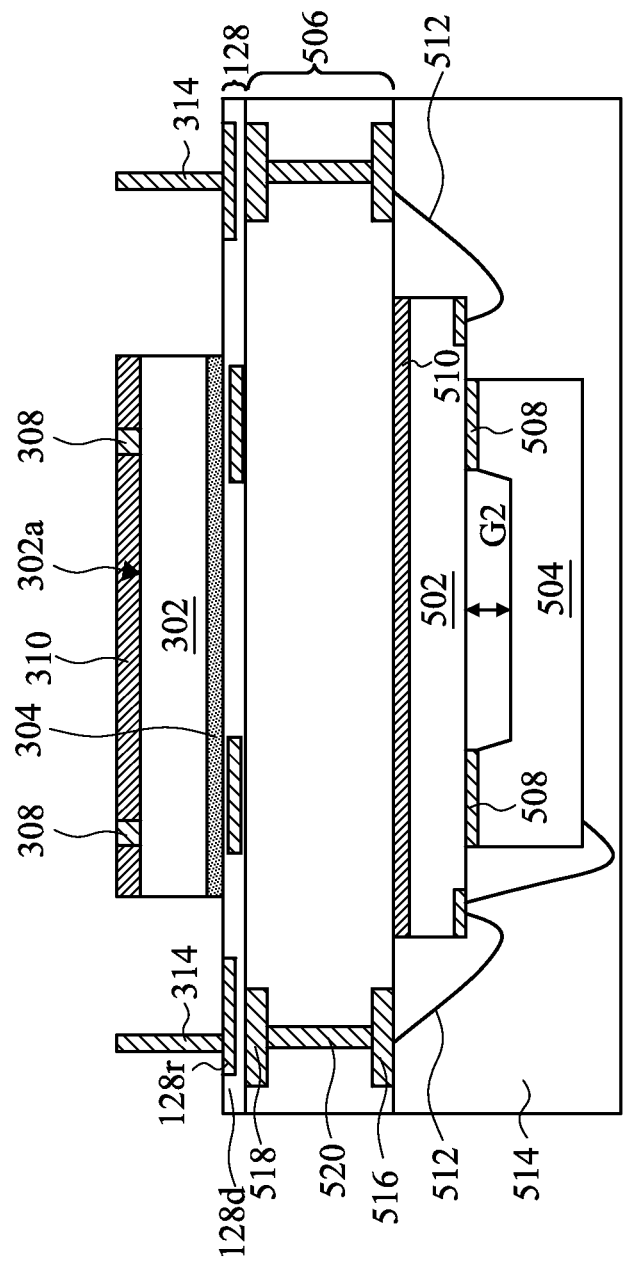

Referring to FIG. 8C, the second device 302 may be placed (e.g. using a pick and place process) over surface of the first RDL 128 facing away from the device wafer 506. In particular, the second device 302 may be attached to the first RDL 128 by the adhesive layer 304, with the active surface 302a of the second device 302 facing away from the device wafer 506. The second device 302 may be placed between adjacent via structures of the one or more first through-vias 314. Accordingly, in some embodiments, at least one via structure 314 may be laterally separated from a sidewall of the second device 302.

Figure 8D:
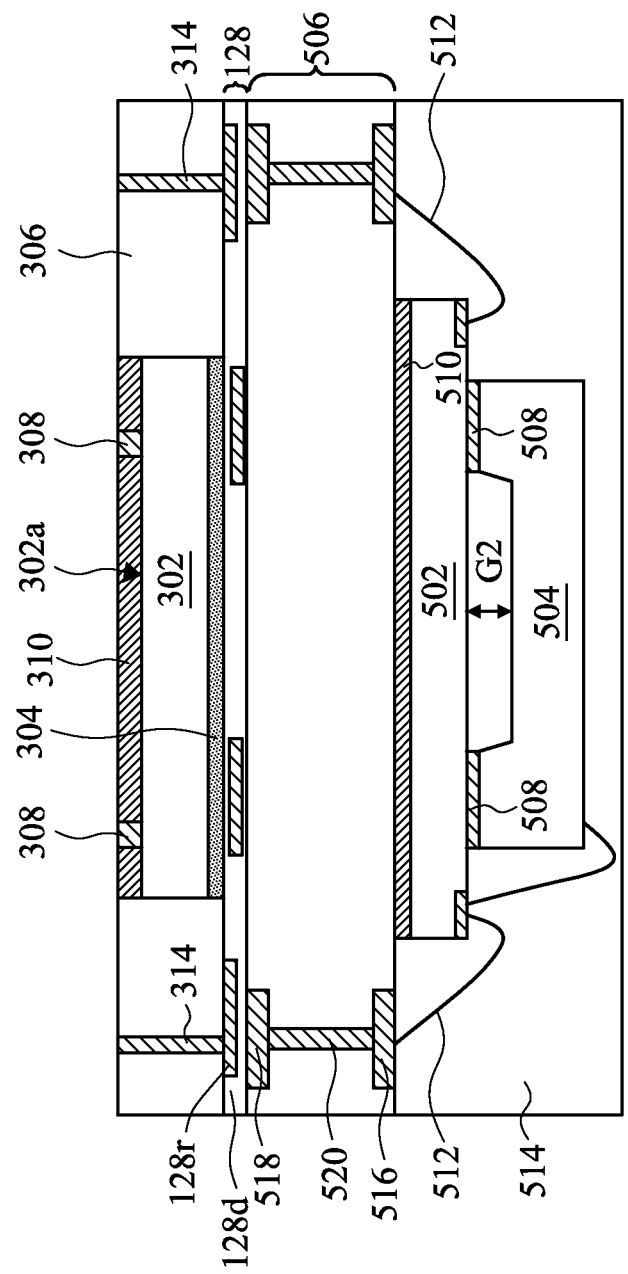

Referring to FIG. 8D, the molding compound 306 may be formed to encapsulate the one or more first through-vias 314 and the second device 302. In some embodiments, the molding compound 306 has a lateral extent that is substantially equal to a lateral extent of the device wafer 506. The process used to form the molding compound 306 in FIG. 8D may be similar to the process described above in relation to FIG. 4E.

Figure 8E:
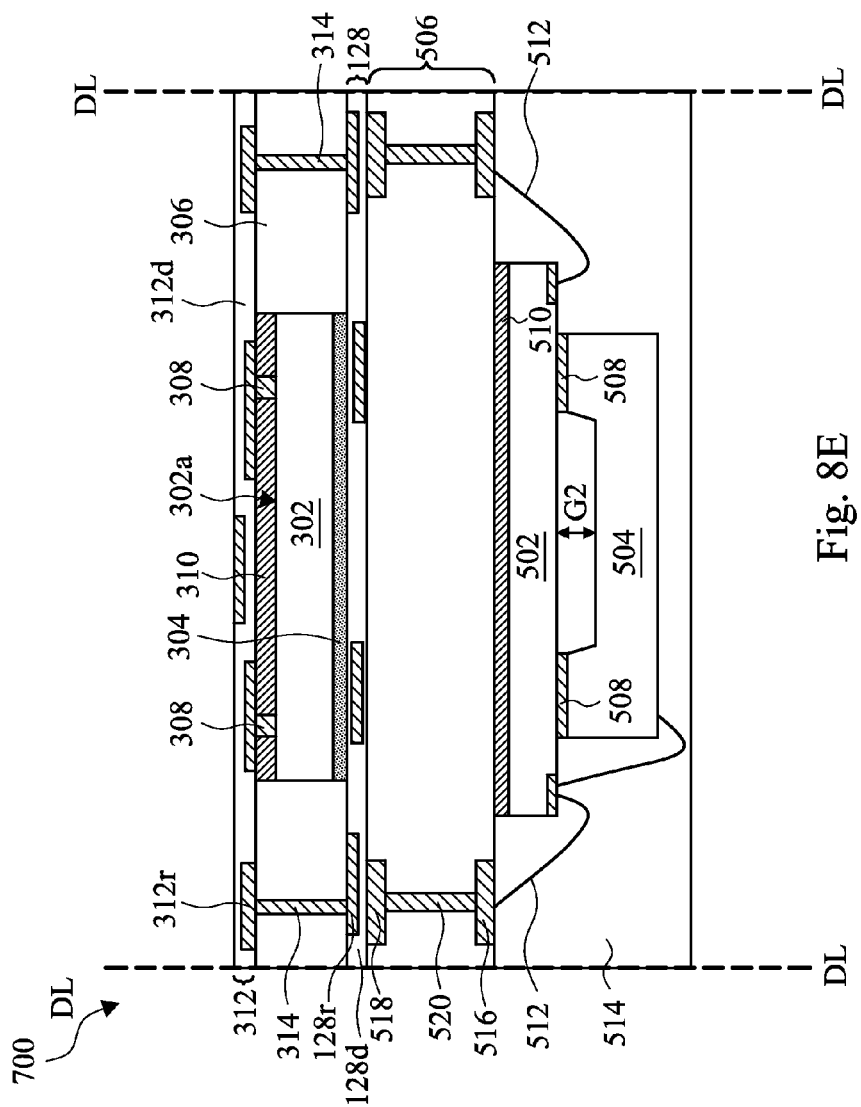

Referring to FIG. 8E, the process flow continues with the formation of the second RDL 312 at the surface of the molding compound 306 facing away from the device wafer 506. The process used to form the second RDL 312 in FIG. 8E may be similar to the process described above in relation to FIG. 4F. Following the formation of the second RDL 312, the plurality of connectors 132 (e.g. shown in FIG. 1A) or the plurality of pads 134 (e.g. shown in FIG. 1B) may be formed at a surface of the second RDL 312 facing away from the device wafer 506. The plurality of connectors 132 and the plurality of pads 134 may be formed using similar processes described above in relation to FIG. 4F. Following this, the double-sided chip-on-wafer MEMS package 700 may be diced (e.g. along dicing line DL, shown in FIG. 8E) thereby singulating the double-sided chip-on-wafer MEMS package 700, which may result in a plurality of chip level MEMS packages.

An advantage provided by the wafer level MEMS package 700 shown in FIG. 7 as well as the process flow illustrated in FIGS. 8A to 8E is a chip-on-wafer level packaging solution for MEMS. Furthermore, the process flow illustrated in FIGS. 8A to 8E is a cost effective process that avoids the cost of using temporary carriers and carrier debonding. The process flow also results in a batch process that achieves high manufacturing throughput. Furthermore, the integration of a device wafer 106 that comprises one or more ASIC devices can achieve small form factor and higher performance for smart devices, mobile devices, internet-of-things (IoT) and wearable electronics, as examples. As an example, for respective chip level MEMS package, a single combo ASIC device can control multiple functions of the respective MEMS device included in the respective chip level MEMS package.

The embodiments shown in FIGS. 5, 6A to 6E, 7, 8A to 8E use the plurality of wire bonds 512 to interconnect the MEMS cap 504 and the MEMS chip 502 to each other and to the device wafer 506. However, the interconnect length among the MEMS cap 504, the MEMS chip 502, and the device wafer 506 may be shortened by using an interconnect structure other than the plurality of wire bonds 512. Such an embodiment is shown in FIG. 9.

FIG. 9 shows a single-sided chip-on-wafer MEMS package 900 having one or more third through-vias 902 in the MEMS cap 504, in accordance with one or more embodiments. As shown in FIG. 9, the plurality of wire bonds 512 is replaced with one or more third through-vias 902 that interconnect the MEMS cap 504 to the MEMS chip 502 and to the device wafer 506. In the example shown in FIG. 9, the MEMS cap 504 is disposed between the MEMS chip 502 and the device wafer 506. The one or more third through-vias 902 extend from a surface of the MEMS cap 504 proximal the MEMS chip 502 to a surface of the MEMS cap 504 distal the MEMS chip 502. Portions of the one or more third through-vias 902 proximal the MEMS chip 502 may be physically and/or electrically connected to the inter-chip connectors 508, while portions of the one or more third through-vias 902 distal the MEMS chip 502 may be physically and/or electrically connected to contact pads 904 disposed at a surface of the MEMS cap 504 facing the device wafer 506. The contact pads 904 may comprise similar materials as the plurality of interconnect structures 120.

As shown in FIG. 9, a third RDL 928 may be disposed between the contact pads 904 and the device wafer 506. In particular, the third RDL 928 may be disposed at the surface of the device wafer 506 having the first pads 516 thereat. In some embodiments, the surface of the device wafer 506 having the first pads 516 thereat may be a front side of the device wafer 506. In such an embodiment, the first pads 516 of the device wafer 506 may be front side pads of the device wafer 506. In another embodiment, the surface of the device wafer 506 having the second pads 518 thereat may be the front side of the device wafer 506. In this embodiment, the second pads 518 of the device wafer 506 may be the front side pads of the device wafer 506.

The third RDL 928 may include conductive structures 928r (e.g. contact pads, conductive traces, UBMs, or the like) that may be partially or fully disposed within an insulating layer 928d (e.g. a dielectric layer). In some embodiments, the insulating layer 928d may comprise a plurality of sub-layers (e.g. a plurality of dielectric sub-layers). The conductive structures 928r may comprise similar materials as the plurality of interconnect structures 120. The third RDL 928 may be a multi-level structure having conductive structures 928r formed over a plurality of layers or levels or the third RDL 928 may be a single-level structure having a single level conductive structure 128r (e.g. a conductive trace). One or more of the conductive structures 928r of the third RDL 928 may be physically and/or electrically connected to the first pads 516. Furthermore, one or more of the conductive structures 928r of the third RDL 928 may be physically and/or electrically connected to conductive elements 906 (e.g. bumps, such as C4 solder bumps or micro-bumps). Conductive elements 906 are disposed between the third RDL 928 and the MEMS cap 504. The conductive elements 906 may comprise similar materials as the plurality of connectors 132 and may further be physically and/or electrically connected to the contact pads 904.

With the arrangement shown in FIG. 9, the interconnect length among the MEMS cap 504, the MEMS chip 502, and the device wafer 506 may be shortened through the use of the one or more third through-vias 902. This shortening of the interconnect length among the MEMS cap 504, the MEMS chip 502, and the device wafer 506 may allow for low parasitics, high memory bandwidth, and high capacity compared to previous embodiments. This also may result in low power consumption of the MEMS package 900 compared to previous embodiments, thus allowing the various MEMS packages to be used in a variety of applications, such as an internet-of-things (IoT) and wearable electronics, as examples.

In the embodiment shown in FIG. 9, analog function of the MEMS package 900 may be included in the device wafer 506 and/or the MEMS chip 502. However, in another embodiment, the analog function of the MEMS package 900 may be partitioned out of the device wafer 506 and/or MEMS chip 502 as a separate analog chip. Such an embodiment is shown in FIG. 10.

FIG. 10 shows a single-sided chip-on-wafer MEMS package 1000 having an analog chip 1002, in accordance with one or more embodiments. As shown in FIG. 10, the analog chip 1002 may be disposed at a surface of the MEMS chip 502 facing away from the MEMS cap 504. The analog chip 1002 may be attached to the MEMS chip 502 by an adhesive or through other chip-to-chip bonding techniques. The one or more third through-vias 902 may further extend into the MEMS chip 502 in order to make physical and/or electrical contact with the analog chip 1002. Consequently, the analog chip 1002, the MEMS cap 504, and the MEMS chip 502 are electrically connected to one another and to the device wafer 506.

Figure 11A:
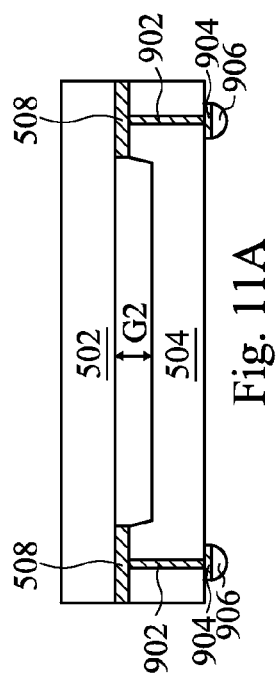

FIGS. 11A to 11F show a process flow illustrating a method of manufacturing a single-sided chip-on-wafer MEMS package having one or more third through-vias, in accordance with one or more embodiments. As an example, the process flow shown in FIGS. 11A to 11F may be used to manufacture the MEMS packages 900 and 1000 shown in FIGS. 9 and 10, respectively. Referring to FIG. 11A, the conductive elements 906 may be formed at the contact pads 904 formed at the surface of the MEMS cap 504 facing away from the MEMS chip 502. The conductive elements 906 may be formed at the contact pads 904 by evaporation, electroplating, printing, solder transfer, ball placement, or the like.

Figure 11B:
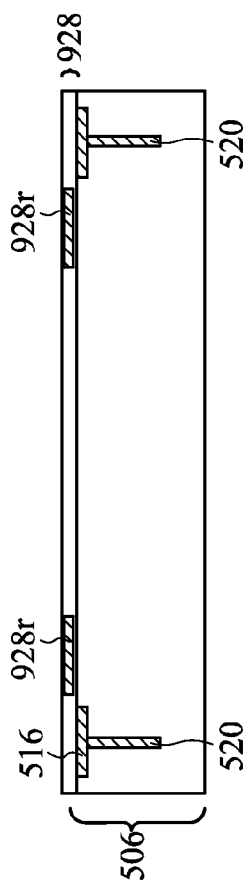

Referring to FIG. 11B, the third RDL 928 may be formed at the surface of the device wafer 506 having the first pads 516. The third RDL 928 may be formed using similar processes as described above in relation to the first RDL 128. As shown in FIG. 11B, at this stage of the process flow, the one or more second through-wafer vias 520 may extend partially into the device wafer 506, e.g. from the surface of the device wafer 506 having the first pads 516 into an interior region of the device wafer 506.

Figure 11C:
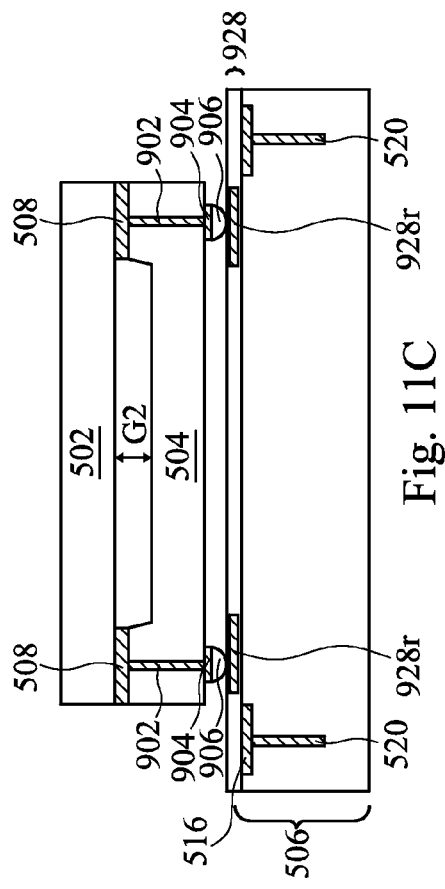

Referring to FIG. 11C, the MEMS chip 502 and MEMS cap 504 may be bonded or attached to the third RDL 928 (e.g. using flip-chip bonding techniques). As described above in relation to FIG. 9, one or more of the conductive structures 928r of the third RDL 928 may be physically and/or electrically connected to conductive elements 906. Referring to FIG. 11D, the molding compound 514 may be formed over the third RDL 928 to encapsulate the conductive elements 906, the space between the MEMS cap 504 and the third RDL 928, the MEMS cap 504, and the MEMS device 502. The process used may be similar to that described above in FIG. 4E in relation to the formation of molding compound 306.

Following this, as shown in FIG. 11E, the device wafer 506 may be thinned using the third thinning process 602, which may be applied to the surface of the device wafer 506 facing away from the MEMS chip 502. The third thinning process 602 may expose the one or more second through-wafer vias 520. Furthermore, the second pads 518 may be formed over exposed portions of the one or more second through-wafer vias 520 (e.g. by a plating process or by a deposition and etching process). The third thinning process 602 may be performed using an etching process and/or a planarization process, such as a mechanical grinding process or a chemical mechanical polishing (CMP) process.

Figure 11F:
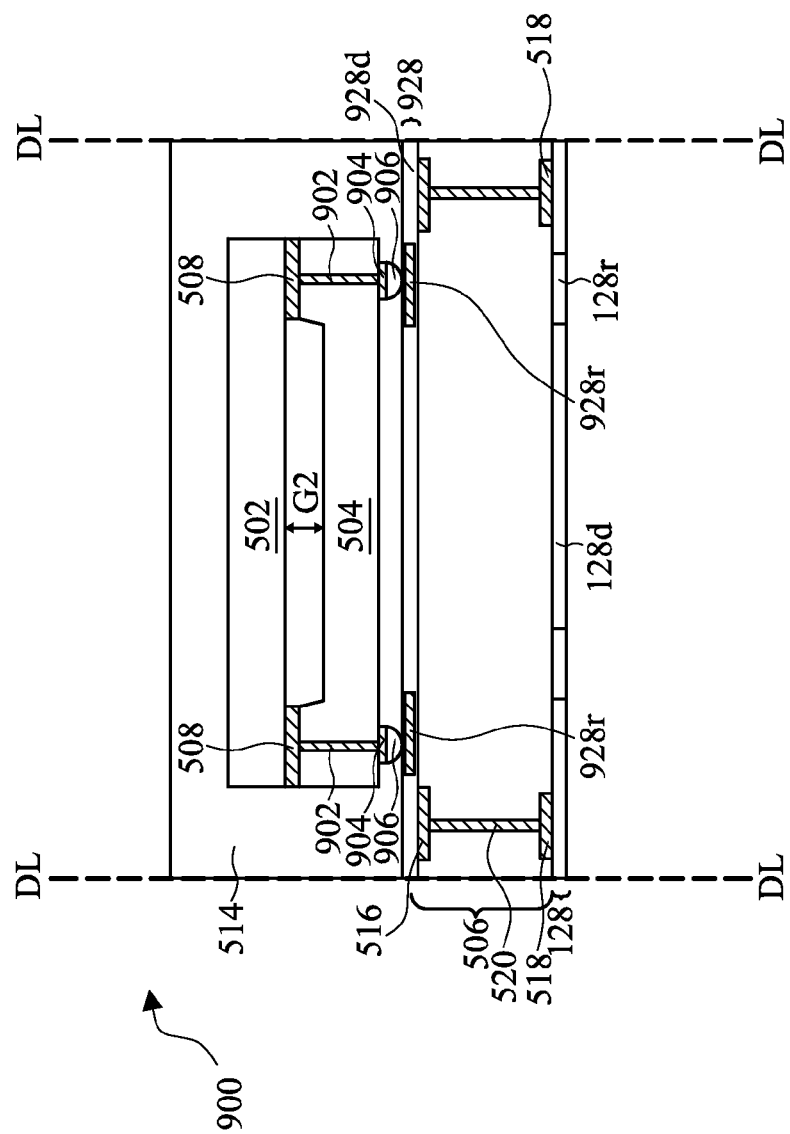

Referring to FIG. 11F, the first RDL 128 may be formed at the surface of the device wafer 506 having the second pads 518 formed thereat. In some embodiments, the first RDL 128 may be formed on a carrier and thereafter separated from the carrier and placed at the surface of the device wafer 506 having the second pads 518. In another embodiment, however, the first RDL 128 may be formed by alternately forming insulating material (e.g. dielectric material) of the insulating layer 128d at the surface of the device wafer 506 having the second pads 518 and thereafter forming the conductive structures 128r therein. The insulating layer 128d and the conductive structures 128r of the first RDL 128 may be formed by similar processes described above in respect of FIG. 2F.

Following the formation of the first RDL 128, the plurality of connectors 132 (e.g. shown in FIG. 1A) or the plurality of pads 134 (e.g. shown in FIG. 1B) may be formed at a surface of the first RDL 128 facing away from the device wafer 506, e.g. using the processes described above in respect of FIG. 2F. Following this, the chip-on-wafer MEMS package 900 may be diced (e.g. along dicing lines DL, shown in FIG. 11F) thereby resulting in a plurality of chip level MEMS packages.

An advantage provided by the wafer level MEMS packages 900 and 1000 shown in FIGS. 9 and 10 as well as the process flow illustrated in FIGS. 11A to 11F is a chip-on-wafer level packaging solution for MEMS. Furthermore, the process flow illustrated in FIGS. 11A to 11F is a cost effective process that avoids the cost of using temporary carriers and carrier debonding. The process flow also results in a batch process that achieves high manufacturing throughput. Furthermore, the integration of a device wafer 106 that comprises one or more ASIC devices can achieve small form factor and higher performance for smart devices, mobile devices, internet-of-things (IoT) and wearable electronics, as examples. As an example, for respective chip level MEMS package, a single combo ASIC device can control multiple functions of the respective MEMS device included in the respective chip level MEMS package.

Furthermore, with the arrangements shown in FIGS. 9 and 10, the interconnect length among the MEMS cap 504, the MEMS chip 502, and the device wafer 506 may be shortened through the use of the one or more third through-vias 902. This shortening of the interconnect length among the MEMS cap 504, the MEMS chip 502, and the device wafer 506 may allow for low parasitics, high memory bandwidth, and high capacity compared to previous embodiments. This also may result in low power consumption of the MEMS packages 900 and 1000 compared to previous embodiments, thus allowing the various MEMS packages to be used in a variety of applications, such as an internet-of-things (IoT) and wearable electronics, as examples.

In the embodiments shown in FIGS. 9, 10, and 11A to 11F, the chip-on-wafer MEMS packages 900 and 1000 may be a single-sided chip-on-wafer MEMS package. In other words, one side of the device wafer 506 has a chip-level structure (e.g. the MEMS chip 502) stacked thereon, while another side of the device wafer 506 is devoid of a stacked device. However, in some embodiments, the chip-on-wafer MEMS package may be a double-sided chip-on-wafer MEMS package, where chip-level structures are stacked on opposite dies of the device wafer 506. An example of such an embodiment is shown in FIG. 12.

Figure 12:
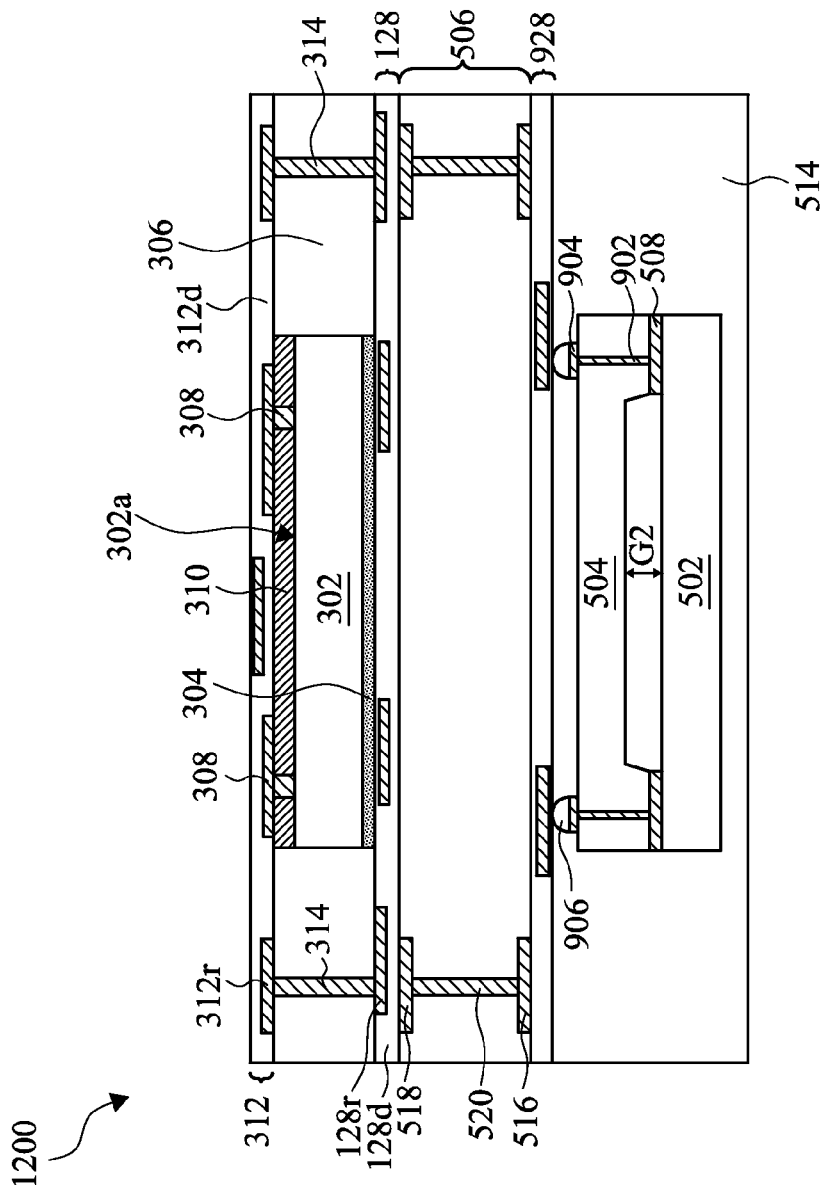
FIG. 12 shows a double-sided chip-on-wafer MEMS package having one or more through-vias in a MEMS cap, in accordance with an embodiment.

FIG. 12 shows a double-sided chip-on-wafer MEMS package 1200 having one or more third through-vias, in accordance with one or more embodiments. It is noted that only one side (e.g. a left side) of the double-sided chip-on-wafer MEMS package 1200 is shown, and the double-sided chip-on-wafer MEMS package 1200 shown in FIG. 12 may be replicated to the left or right (e.g. as in FIG. 5). As shown in FIG. 12, the second device 302 may be formed at the surface of the first RDL 128 facing away from the MEMS chip 502. Consequently, the device wafer 506 may be disposed between the MEMS chip 502 and the second device 302. In an embodiment, the second device 302 may include a MEMS device, an analog device, an energy harvesting device, a sensor device, a logic device, and/or a memory device (e.g. flash device, DRAM, SRAM, SDRAM), although other devices are possible as well. In the example of FIG. 12, the first RDL 128 is a multi-level structure comprising conductive structures 128r disposed across a plurality of layers or levels. However, in some embodiments, the first RDL 128 may be a single level structure comprising a single level conductive structure 128r, which may be a conductive trace.

As shown in FIG. 12, the second device 302 may be attached to the device wafer 506 by the adhesive layer 304. As an example, the adhesive layer 304 may attach the one or more second devices 302 to the insulating layer 128d of the first RDL 128, thereby attaching the second device 302 to the device wafer 506.

The second device 302 may be encapsulated in the molding compound 306. In the example of FIG. 12, the active surface 302a of the second device 302 may face away from the device wafer 506. Metal bumps 308 may be formed at the active surface 302a of the second device 302. In some embodiments, the active surface 302a of the second device 302 may have contact pads (e.g. I/O pads) formed thereon (not shown in FIG. 12). In such embodiments, the metal bumps 308 are disposed over and cover the contact pads of the second device 302. Also formed at the active surface 302a is the device insulating layer 310 (e.g. comprising a dielectric material) that covers the active surface 302a and surrounds the metal bumps 308 of the second device 302.

The double-sided chip-on-wafer MEMS package 1200 also comprises the second RDL 312 disposed at the surface of the device insulating layer 310 facing away from the second device 302. The second RDL 312 may include conductive structures 312r (e.g. contact pads, vias, conductive traces, UBMs, or the like) that may be partially or fully disposed within the insulating layer 312d (e.g. a dielectric layer).

The conductive structures 312r of the second RDL 312 may be electrically and/or physically coupled to the metal bumps 308 and may also be electrically and/or physically coupled to the one or more first through-vias 314 extending through the molding compound 306. The one or more first through-vias 314 may be electrically and/or physically coupled to the first RDL 128. Consequently, the second device 302 may be electrically connected to the device wafer 506 through the metal bumps 308, the second RDL 312, the one or more first through-vias 314, and the first RDL 128. Furthermore, the second device 302 may be electrically connected to the MEMS chip 502 through the metal bumps 308, the second RDL 312, the one or more first through-vias 314, the first RDL 128, the second pads 518, the one or more second through-wafer vias 520, the first pads 516, the third RDL 928, the conductive elements 906, the contact pads 904, the one or more third through-vias 902, and the plurality of inter-chip connectors 508. In some embodiments, the plurality of connectors 132 or the plurality of pads 134 may also be formed at a surface of the second RDL 312 facing away from the second device 302. The process flow used to manufacture the double-sided chip-on-wafer MEMS package 1200 may, as an example, be similar to the process flow shown in FIGS. 8A to 8E.

The advantages described above in relation to FIGS. 9 and 10 are also realized with the embodiment shown in FIG. 12.

According to various embodiments described herein, a method of manufacturing a MEMS package is provided. In an embodiment, the method comprises: attaching a MEMS structure having a capping structure thereon to a device wafer comprising a plurality of first devices formed therein to form a wafer level MEMS package; and singulating the device wafer having the MEMS structure attached thereto to form a plurality of chip scale MEMS packages.

According to various embodiments described herein, a method of manufacturing a MEMS package is provided. In an embodiment, the method comprises: coupling a MEMS structure having a capping structure thereon to a device wafer comprising a plurality of first devices to form a wafer level MEMS package; after the coupling, thinning the wafer level MEMS package to expose conductive features in the device wafer; forming a first redistribution layer (RDL) at a surface of the thinned wafer level MEMS package, the first RDL electrically coupled to the exposed conductive features; and singulating the wafer level MEMS package to form a plurality of chip scale MEMS packages.

According to various embodiments described herein, a method of manufacturing a MEMS package is provided. In an embodiment, the method comprises: disposing a plurality of MEMS devices over a device wafer comprising a plurality of first devices formed therein, the plurality of MEMS devices electrically coupled to the plurality of first devices; exposing conductive features in the device wafer using a thinning process; forming a first redistribution layer (RDL) over a surface of the device wafer exposed to the thinning process, the first RDL electrically coupled to the conductive features in the device layer; and dicing the device wafer and the first RDL to separate the plurality of first devices from each other and the plurality of MEMS devices from each other.

According to various embodiments described herein, a MEMS package is provided. In an embodiment, the MEMS package comprises: a first device substrate comprising one or more first devices formed therein; a MEMS structure having a capping structure thereon disposed at a first major surface of the first device substrate; and a second device substrate comprising one or more second devices formed therein, the second device substrate disposed at a second major surface of the first device substrate, the second major surface opposite the first major surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a microelectromechanical systems (MEMS) package, the method comprising:
   bonding a capping structure to a MEMS device to form a MEMS structure, wherein the capping structure comprises a substrate and an oxide layer, the substrate having a cavity disposed in a first surface thereof, wherein the oxide layer lines the cavity, and wherein the oxide layer is interposed between the substrate of the capping structure and the MEMS device;
   attaching the MEMS structure to a device wafer comprising a plurality of first devices formed therein to form a wafer level MEMS package; and
   singulating the device wafer having the MEMS structure attached thereto to form a plurality of chip scale MEMS packages.

2. The method of claim 1, wherein a first one of the plurality of chip scale MEMS packages comprises a first one of the plurality of first devices, and wherein a second one of the plurality of chip scale MEMS packages comprises a second one of the plurality of first devices.

3. The method of claim 1, wherein the MEMS structure comprises a MEMS wafer comprising a plurality of MEMS devices, and wherein the capping structure comprises a capping wafer comprising the substrate and the oxide layer, the capping wafer having a plurality of cavities lined by the oxide layer, each of the plurality of cavities disposed over a respective one of the plurality of MEMS devices.

4. The method of claim 3, wherein the singulating further comprises singulating the MEMS wafer and the capping wafer, wherein a first one of the plurality of chip scale MEMS packages comprises a first one of the plurality of MEMS devices, and wherein a second one of the plurality of chip scale MEMS packages comprises a second one of the plurality of MEMS devices.

5. The method of claim 1, wherein the attaching the MEMS structure to the device wafer comprises:
   forming a plurality of inter-wafer connectors at standoff regions of the MEMS structure, the standoff regions extending from a major surface of the MEMS structure away from the capping structure; and
   bonding the plurality of inter-wafer connectors to a metal feature of the device wafer.

6. The method of claim 5, wherein the bonding the plurality of inter-wafer connectors comprises a thermal compression bond (TCB) process.

7. The method of claim 1, wherein the MEMS device comprises a MEMS chip, and wherein the capping structure comprises a MEMS cap disposed on a surface of the MEMS chip.

8. The method of claim 7, wherein the attaching the MEMS structure to the device wafer comprises attaching the MEMS structure to the device wafer using an adhesive layer disposed between the MEMS structure and the device wafer.

9. The method of claim 8, wherein the MEMS structure is electrically coupled to the plurality of first devices by a plurality of wirebonds.

10. The method of claim 7, wherein the attaching the MEMS structure to the device wafer comprises bonding the MEMS cap to the device wafer using a plurality of inter-chip connectors disposed between the MEMS cap and the device wafer.

11. The method of claim 10, wherein the MEMS structure is electrically coupled to the plurality of first devices by one or more through-vias extending through the MEMS cap.

12. A method of manufacturing a microelectromechanical systems (MEMS) package, the method comprising:
   bonding a capping structure to a MEMS device to form a MEMS structure, the capping structure having a cavity disposed therein, the cavity disposed over a sensing feature of the MEMS device;
   forming standoff structures in the MEMS device of the MEMS structure, the standoff structures disposed at a surface of the MEMS structure opposite the capping structure;
   forming openings in a device wafer comprising a plurality of first devices, wherein the openings are formed in a dielectric layer of the device wafer, wherein the openings expose a metal layer under the dielectric layer, wherein the device wafer is separate from the MEMS structure;
   after forming the standoff structures and openings, aligning the standoff structures to the openings in the device wafer;
   after aligning the standoff structures to the openings, coupling the standoff structures of the MEMS structure to the corresponding metal layer of the openings in the device wafer via corresponding inter-wafer connectors to form a wafer level MEMS package, wherein each of the corresponding inter-wafer connectors extends into a corresponding opening and physically contacts a corresponding standoff structure and a metal layer of the corresponding opening in the device wafer;
   after the coupling, thinning the wafer level MEMS package to expose conductive features in the device wafer;

forming a first redistribution layer (RDL) at a surface of the thinned wafer level MEMS package, the first RDL electrically coupled to the exposed conductive features; and singulating the wafer level MEMS package to form a plurality of chip scale MEMS packages.

13. The method of claim 12, wherein the MEMS structure and the capping structure comprises a MEMS chip and a MEMS cap disposed over the MEMS chip, respectively, and wherein the method further comprises encapsulating the MEMS chip and the MEMS cap in a first molding compound after the coupling and prior to the thinning.

14. The method of claim 12, further comprising:
prior to the singulating, coupling a plurality of second devices on a surface of the first RDL facing away from the device wafer; and
encapsulating the plurality of second devices in a second molding compound.

15. The method of claim 12, wherein a width of the MEMS structure and a width of the device wafer are in a range from about 8 inches to about 18 inches.

16. The method of claim 12, wherein a width of the MEMS structure is in a range from about 6 inches to about 12 inches, and wherein a width of the device wafer is in a range from about 8 inches to about 18 inches.

17. A microelectromechanical systems (MEMS) package, comprising:
a first device substrate comprising one or more first devices formed therein;
a MEMS structure having a capping structure thereon disposed at a first major surface of the first device substrate; and a second device substrate comprising one or more second devices formed therein, the second device substrate disposed at a second major surface of the first device substrate, the second major surface opposite the first major surface, wherein the second device substrate comprises metal bumps formed at an active surface of the second device substrate, wherein the active surface of the second device faces away from the first device substrate, wherein the second device substrate is laterally encapsulated within a first molding compound wherein the first molding compound has a same lateral extent as the first device substrate,
wherein the MEMS structure comprises a plurality of standoff regions at the first major surface of the first device substrate, and wherein a sealing connector couples the standoff regions to the first device substrate and provides a sealed cavity between the MEMS structure and the first device substrate.

18. The MEMS package of claim 17, wherein the MEMS structure and the capping structure are encapsulated in a second molding compound.

19. The MEMS package of claim 17, further comprising a first redistribution layer (RDL) disposed between the first device substrate and the second device substrate and a second RDL disposed on the active surface of the second device substrate, wherein the one or more first devices and the one or more second devices are electrically coupled by the first RDL and the second RDL.

20. The MEMS package of claim 17, further comprising an adhesive layer coupling the first device substrate and the second device substrate to each other.

* * * * *